United States Patent
Beukman et al.

(10) Patent No.: US 12,287,591 B2
(45) Date of Patent: Apr. 29, 2025

(54) LITHOGRAPHIC APPARATUS, METROLOGY SYSTEMS, AND METHODS THEREOF

(71) Applicants: ASML Netherlands B.V., Veldhoven (NL); ASML Holding N.V., Veldhoven (NL)

(72) Inventors: Arjan Johannes Anton Beukman, Son en Breugel (NL); Sebastianus Adrianus Goorden, Eindhoven (NL); Stephen Roux, New Fairfield, CT (US); Sergei Sokolov, Eindhoven (NL); Filippo Alpeggiani, Eindhoven (NL)

(73) Assignee: ASML Netherlands B.V. & ASML Holding N.V., Veldhoven (NL)

( * ) Notice: Subject to any disclaimer, the term of this patent is extended or adjusted under 35 U.S.C. 154(b) by 171 days.

(21) Appl. No.: 18/269,191

(22) PCT Filed: Dec. 2, 2021

(86) PCT No.: PCT/EP2021/084063
§ 371 (c)(1),
(2) Date: Jun. 22, 2023

(87) PCT Pub. No.: WO2022/135870
PCT Pub. Date: Jun. 30, 2022

(65) Prior Publication Data
US 2024/0036485 A1 Feb. 1, 2024

Related U.S. Application Data

(60) Provisional application No. 63/129,714, filed on Dec. 23, 2020.

(51) Int. Cl.
*G03F 7/00* (2006.01)
*G03F 9/00* (2006.01)

(52) U.S. Cl.
CPC ........ *G03F 9/7065* (2013.01); *G03F 7/70625* (2013.01); *G03F 9/7046* (2013.01)

(58) Field of Classification Search
CPC ............. G03F 7/70616; G03F 7/70625; G03F 7/706849; G03F 9/7046; G03F 9/7065
See application file for complete search history.

(56) References Cited

U.S. PATENT DOCUMENTS

| | | |
|---|---|---|
| 6,297,876 B1 | 10/2001 | Bornebroek |
| 6,961,116 B2 | 11/2005 | Den Boef et al. |

(Continued)

FOREIGN PATENT DOCUMENTS

| | | |
|---|---|---|
| EP | 2 766 693 B1 | 12/2020 |
| JP | H02205374 A | 8/1990 |

(Continued)

OTHER PUBLICATIONS

International Search Report and Written Opinion of the International Searching Authority directed to International Patent Application No. PCT/EP2021/084063, mailed Mar. 28, 2022; 11 pages.

(Continued)

*Primary Examiner* — Peter B Kim
(74) *Attorney, Agent, or Firm* — Sterne, Kessler, Goldstein, & Fox P.L.L.C

(57) ABSTRACT

A method includes irradiating a target structure with sequential illumination shots, directing scattered beams from the target structure towards an imaging detector, generating a detection signal using the imaging detector, and determining a property of the target structure based on at least the detection signal. An integration time for each illumination shot of the sequential illumination shots is selected so to reduce a low frequency error.

20 Claims, 17 Drawing Sheets

(56) References Cited

U.S. PATENT DOCUMENTS

| | | | |
|---|---|---|---|
| 7,511,799 B2 | 3/2009 | Tel et al. | |
| 8,706,442 B2 | 4/2014 | Mos et al. | |
| 9,778,025 B2 | 10/2017 | Mathijssen et al. | |
| 9,939,742 B2 | 4/2018 | Tinnemans et al. | |
| 2009/0195768 A1 | 8/2009 | Bijnen et al. | |
| 2018/0299790 A1 | 10/2018 | Shome et al. | |
| 2023/0142459 A1* | 5/2023 | Judge | G03F 7/70916 |
| | | | 356/237.5 |

FOREIGN PATENT DOCUMENTS

| | | |
|---|---|---|
| JP | H03240282 A | 10/1991 |
| JP | 3063569 B2 | 7/2000 |
| WO | WO 2018/192723 A1 | 10/2018 |
| WO | WO 2020/057900 A1 | 3/2020 |
| WO | WO 2021/133568 A1 | 7/2021 |

OTHER PUBLICATIONS

Niu et al., "Specular Spectroscopic Scatterometry in DUV Lithography," Proc. SPIE, vol. 3677, Metrology, Inspection, and Process Control for Microlithography XIII, Jun. 14, 1999; 10 pages.

Raymond et al., "Multiparameter grating metrology using optical scatterometry," Proc. SPIE, vol. 2725, Metrology, Inspection, and Process Control for Microlithography X, May 21, 1996; pp. 361-368.

"Lithographic Apparatus, Metrology Systems, and Methods Thereof," Research Disclosure No. 683045, Feb. 5, 2021; 54 pages.

\* cited by examiner

LITHOGRAPHIC APPARATUS, METROLOGY SYSTEMS, AND METHODS THEREOF

CROSS-REFERENCE TO RELATED APPLICATIONS

This application claims priority of U.S. Provisional Patent Application No. 63/129,714, which was filed on Dec. 23, 2020, and which is incorporated herein in its entirety by reference.

FIELD

The present disclosure relates to a lithographic apparatus, for example, a lithographic apparatus for irradiating an object with sequential illumination shots.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, can be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel to this scanning direction. It is also possible to transfer the pattern from the patterning device to the substrate by imprinting the pattern onto the substrate.

Another lithographic system is an interferometric lithographic system where there is no patterning device, but rather a light beam is split into two beams, and the two beams are caused to interfere at a target portion of the substrate through the use of a reflection system. The interference causes lines to be formed at the target portion of the substrate.

During lithographic operation, different processing steps may require different layers to be sequentially formed on the substrate. Accordingly, it can be necessary to position the substrate relative to prior patterns formed thereon with a high degree of accuracy. Generally, alignment marks are placed on the substrate to be aligned and are located with reference to a second object. A lithographic apparatus may use an alignment apparatus for detecting positions of the alignment marks and for aligning the substrate using the alignment marks to ensure accurate exposure from a mask. Misalignment between the alignment marks at two different layers is measured as overlay error.

In order to monitor the lithographic process, parameters of the patterned substrate are measured. Parameters may include, for example, the overlay error between successive layers formed in or on the patterned substrate and critical linewidth of developed photosensitive resist. This measurement can be performed on a product substrate and/or on a dedicated metrology target. There are various techniques for making measurements of the microscopic structures formed in lithographic processes, including measurement of multiple wavelengths in parallel or sequentially.

SUMMARY

Using multiple wavelengths in measurements is important to correct for mark asymmetries. Accordingly, there is a need to obtain measurements using multiple wavelengths efficiently.

In some embodiments, a method includes irradiating a target structure with sequential illumination shots, directing scattered beams from the target structure towards an imaging detector, generating a detection signal using the imaging detector, and determining a property of the target structure based on at least the detection signal. An integration time for each illumination shot of the sequential illumination shots is selected to reduce a low frequency error.

In some embodiments, a system includes an illumination system configured to irradiate a target structure with sequential illumination shots, a detection system configured to direct scattered beams from the target structure towards an imaging detector, the imaging detector configured to generate a detection signal, and processing circuitry configured to determine a property of the target structure based on at least the detection signal. An integration time for each illumination shot of the sequential illumination shots is selected to reduce a low frequency error.

Further features of the present disclosure, as well as the structure and operation of various embodiments, are described in detail below with reference to the accompanying drawings. It is noted that the present disclosure is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present disclosure and, together with the description, further serve to explain the principles of the present disclosure and to enable a person skilled in the relevant art(s) to make and use embodiments described herein.

Figure 1A:
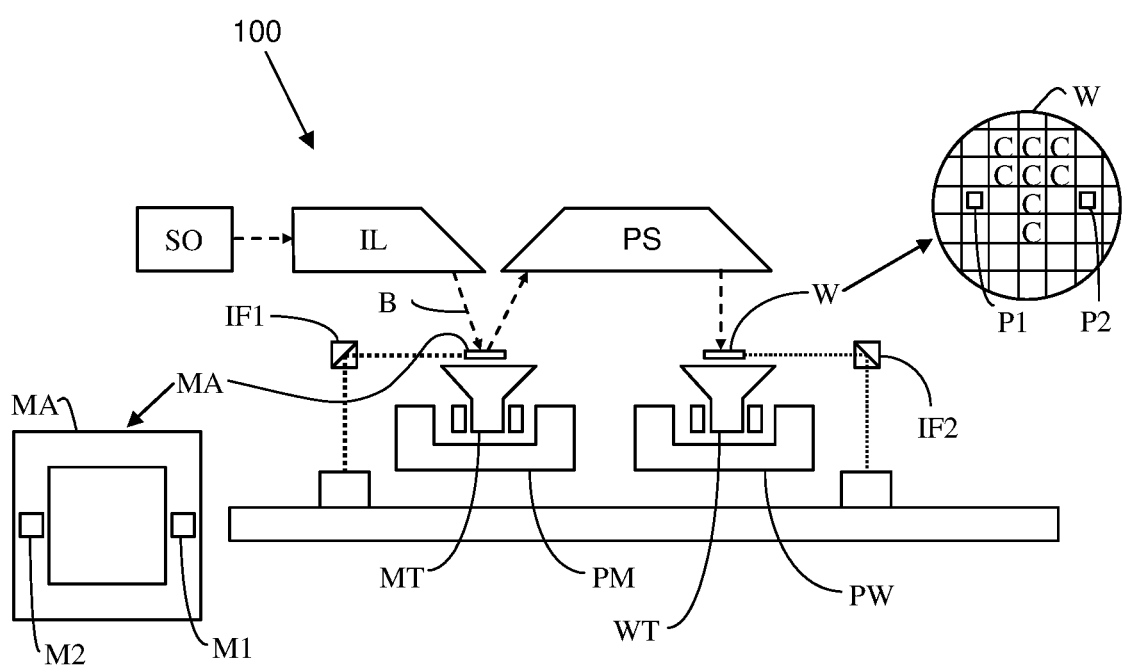
FIG. 1A shows a schematic of a reflective lithographic apparatus, according to some embodiments.

The features of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of the present disclosure. The disclosed embodiment(s) are provided as examples. The scope of the present disclosure is not limited to the disclosed embodiment(s). Claimed features are defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the disclosure can be implemented in hardware, firmware, software, or any combination thereof. Embodiments of the disclosure may also be implemented as instructions stored on a machine-readable medium, which can be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions can be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present disclosure can be implemented.

Example Lithographic Systems

Figure 1B:
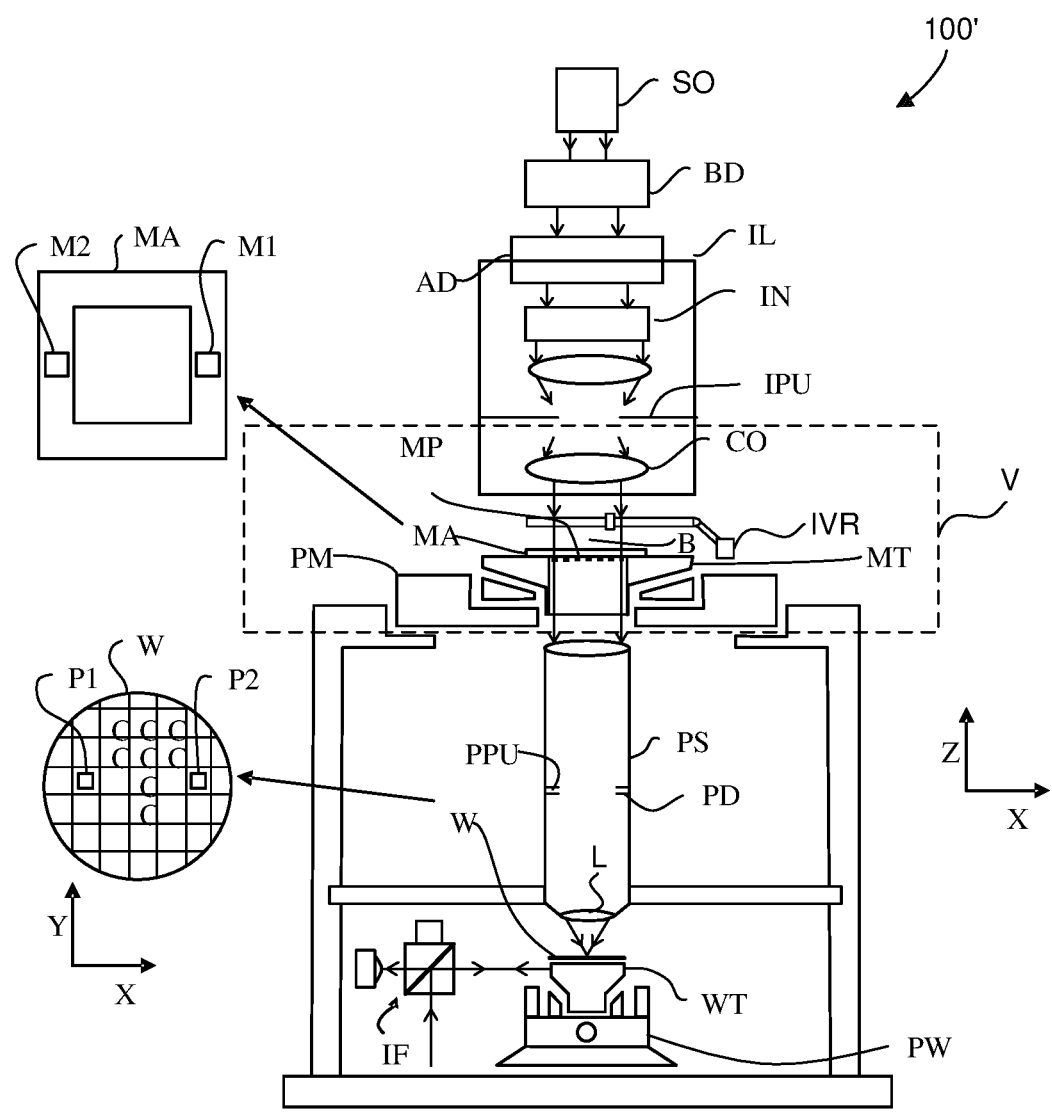
FIG. 1B shows a schematic of a transmissive lithographic apparatus, according to some embodiments.

FIGS. 1A and 1B show schematic illustrations of a lithographic apparatus 100 and lithographic apparatus 100', respectively, in which embodiments of the present disclosure may be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT may be a frame or a table, for example, which may be fixed or movable, as required. By using sensors, the support structure MT may ensure that the patterning device MA is at a desired position, for example, with respect to the projection system PS.

The term "patterning device" MA should be broadly interpreted as referring to any device that may be used to impart a radiation beam B with a pattern in its cross-section, such as to create a pattern in the target portion C of the substrate W. The pattern imparted to the radiation beam B may correspond to a particular functional layer in a device being created in the target portion C to form an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, or programmable LCD panels. Masks are well known in lithography, and include mask types such as binary, alternating phase shift, or attenuated phase shift, as well as various hybrid mask types. An example of a programmable mirror array employs a matrix arrangement of small mirrors, each of which may be individually tilted so as to reflect an incoming radiation beam in different directions. The tilted mirrors impart a pattern in the radiation beam B, which is reflected by a matrix of small mirrors.

The term "projection system" PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

Lithographic apparatus 100 and/or lithographic apparatus 100' may be of a type having two (dual stage) or more substrate tables WT (and/or two or more mask tables). In such "multiple stage" machines, the additional substrate tables WT may be used in parallel, or preparatory steps may be carried out on one or more tables while one or more other substrate tables WT are being used for exposure. In some situations, the additional table may not be a substrate table WT.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system Immersion techniques are well known in the art for increasing the numerical aperture of projection systems. The term "immersion" as used herein does not mean that a structure, such as a substrate, is submerged in liquid, but rather only means that liquid is located between the projection system and the substrate during exposure.

Referring to FIGS. 1A and 1B, the illuminator IL receives a radiation beam from a radiation source SO. The source SO and the lithographic apparatus 100, 100' may be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO may be an integral part of the lithographic apparatus 100, 100', for example, when the source SO is a mercury lamp. The source SO and the illuminator IL, together with the beam delivery system BD, if required, may be referred to as a radiation system.

The illuminator IL may include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator may be adjusted. In addition, the illuminator IL may comprise various other components (in FIG. 1B), such as an integrator IN and a condenser CO. The illuminator IL may be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT may be moved accurately (for example, so as to position different target portions C in the path of the radiation beam B). Similarly, the first positioner PM and another position sensor IF1 may be used to accurately position the patterning device (for example, mask) MA with respect to the path of the radiation beam B. Patterning device (for example, mask) MA and substrate W may be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil conjugate PPU to an illumination system pupil IPU. Portions of radiation emanate from the intensity distribution at the illumination system pupil IPU and traverse a mask pattern without being affected by diffraction at the mask pattern and create an image of the intensity distribution at the illumination system pupil IPU.

The projection system PS projects an image MP' of the mask pattern MP, where image MP' is formed by diffracted beams produced from the mark pattern MP by radiation from the intensity distribution, onto a photoresist layer coated on the substrate W. For example, the mask pattern MP may include an array of lines and spaces. A diffraction of radiation at the array and different from zeroth order diffraction generates diverted diffracted beams with a change of direction in a direction perpendicular to the lines. Undiffracted beams (i.e., so-called zeroth order diffracted beams) traverse the pattern without any change in propagation direction. The zeroth order diffracted beams traverse an upper lens or upper lens group of the projection system PS, upstream of the pupil conjugate PPU of the projection system PS, to reach the pupil conjugate PPU. The portion of the intensity distribution in the plane of the pupil conjugate PPU and associated with the zeroth order diffracted beams is an image of the intensity distribution in the illumination system pupil IPU of the illumination system IL. The aperture device PD, for example, is disposed at or substantially at a plane that includes the pupil conjugate PPU of the projection system PS.

The projection system PS is arranged to capture, by means of a lens or lens group L, not only the zeroth order diffracted beams, but also first-order or first- and higher-order diffracted beams (not shown). In some embodiments, dipole illumination for imaging line patterns extending in a direction perpendicular to a line may be used to utilize the resolution enhancement effect of dipole illumination. For example, first-order diffracted beams interfere with corresponding zeroth-order diffracted beams at the level of the wafer W to create an image of the line pattern MP at highest possible resolution and process window (i.e., usable depth of focus in combination with tolerable exposure dose deviations). In some embodiments, astigmatism aberration may be reduced by providing radiation poles (not shown) in opposite quadrants of the illumination system pupil IPU. Further, in some embodiments, astigmatism aberration may be reduced by blocking the zeroth order beams in the pupil conjugate PPU of the projection system associated with radiation poles in opposite quadrants. This is described in more detail in U.S. Pat. No. 7,511,799 B2, issued Mar. 31, 2009, which is incorporated by reference herein in its entirety.

With the aid of the second positioner PW and position sensor IF (for example, an interferometric device, linear encoder, or capacitive sensor), the substrate table WT may be moved accurately (for example, so as to position different target portions C in the path of the radiation beam B). Similarly, the first positioner PM and another position sensor (not shown in FIG. 1B) may be used to accurately position the mask MA with respect to the path of the radiation beam B (for example, after mechanical retrieval from a mask library or during a scan).

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner), the mask table MT may be connected to a short-stroke actuator only or may be fixed. Mask MA and substrate W may be aligned using mask alignment marks M1, M2, and substrate alignment marks P1, P2. Although the substrate alignment marks (as illustrated) occupy dedicated target portions, they may be located in spaces between target portions (known as scribe-lane alignment marks). Similarly, in situations in which more than one die is provided on the mask MA, the mask alignment marks may be located between the dies.

Mask table MT and patterning device MA may be in a vacuum chamber V, where an in-vacuum robot IVR may be used to move patterning devices such as a mask in and out of vacuum chamber. Alternatively, when mask table MT and patterning device MA are outside of the vacuum chamber, an out-of-vacuum robot may be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' may be used in at least one of the following modes:
1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C may be exposed.
2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT may be determined by the (de-)magnification and image reversal characteristics of the projection system PS.
3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO may be employed and the programmable patterning device is updated as required after each movement of the substrate table WT or in between successive radiation pulses during a scan. This mode of operation may be readily applied to maskless lithography that utilizes a programmable patterning device, such as a programmable mirror array.

Combinations and/or variations on the described modes of use or entirely different modes of use may also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
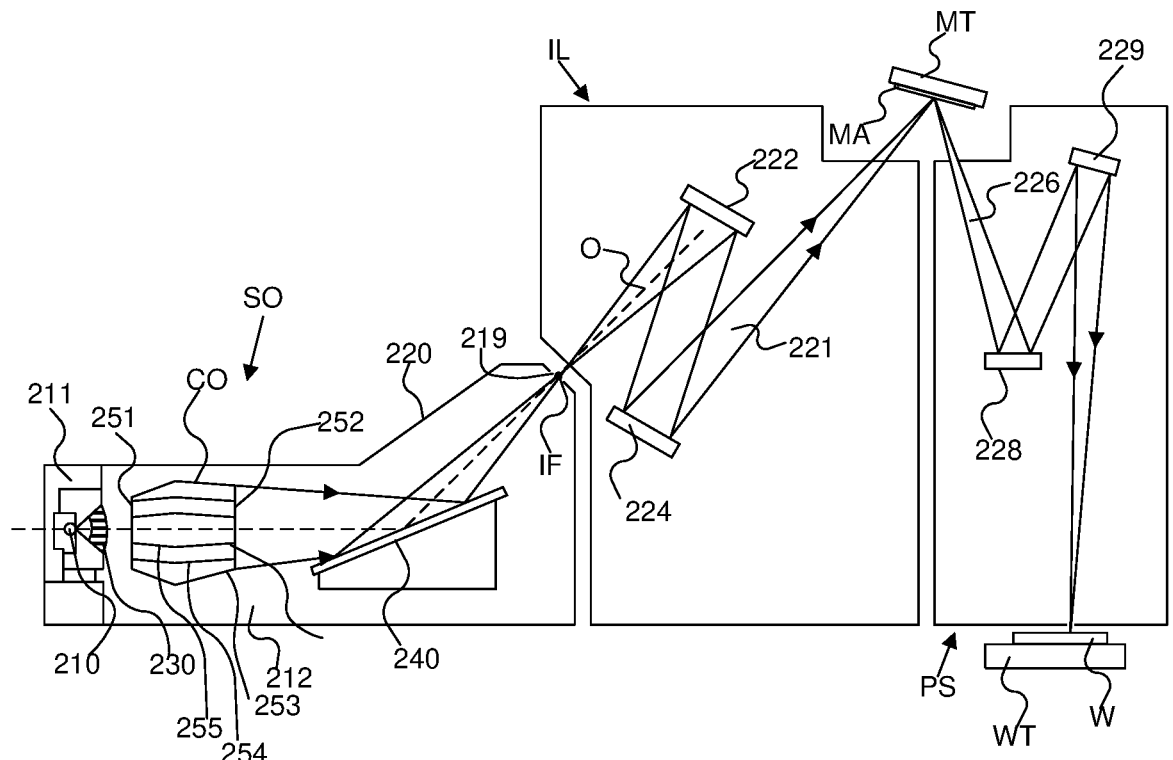
FIG. 2 shows a more detailed schematic of the reflective lithographic apparatus, according to some embodiments.

FIG. 2 shows the lithographic apparatus 100 in more detail, including the source collector apparatus SO, the illumination system IL, and the projection system PS. The source collector apparatus SO is constructed and arranged such that a vacuum environment may be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor, or Sn vapor in which the very hot plasma 210 is created to emit radiation in the EUV range of the electromagnetic spectrum. The very hot plasma 210 is created by, for example, an electrical discharge causing at least a partially ionized plasma. Partial pressures of, for example, 10 Pa of Xe, Li, Sn vapor, or any other suitable gas or vapor may be required for efficient generation of the radiation. In some embodiments, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap), which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure.

The collector chamber 212 may include a radiation collector CO, which may be a so-called grazing incidence collector. Radiation collector CO has an upstream radiation collector side 251 and a downstream radiation collector side 252. Radiation that traverses collector CO may be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the FIG. 2, for example there may be one to six additional reflective elements present in the projection system PS than shown in FIG. 2.

Collector optic CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O and a collector optic CO of this type is preferably used in combination with a discharge produced plasma source, often called a DPP source.

Exemplary Lithographic Cell

Figure 3:
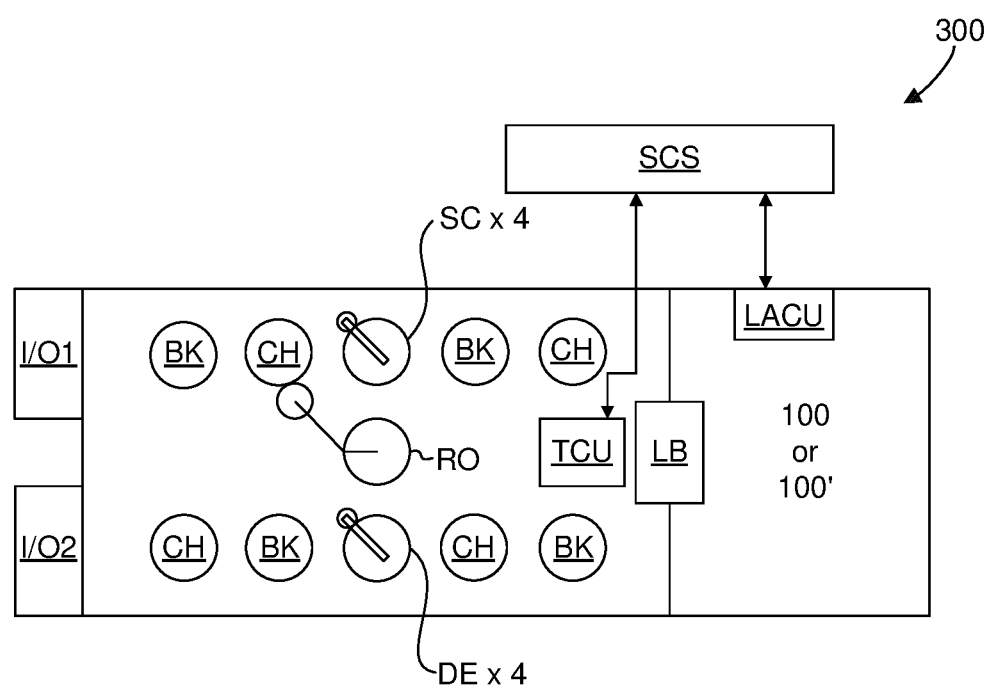
FIG. 3 shows a schematic of a lithographic cell, according to some embodiments.

FIG. 3 shows a lithographic cell 300, also sometimes referred to a lithocell or cluster, according to some embodiments. Lithographic apparatus 100 or 100' may form part of lithographic cell 300. Lithographic cell 300 may also include one or more apparatuses to perform pre- and post-exposure processes on a substrate. Conventionally these include spin coaters SC to deposit resist layers, developers DE to develop exposed resist, chill plates CH, and bake plates BK. A substrate handler, or robot, RO picks up substrates from input/output ports I/O1, I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses may be operated to maximize throughput and processing efficiency.

Exemplary Inspection Apparatuses

In order to control the lithographic process to place device features accurately on the substrate, alignment marks are generally provided on the substrate, and the lithographic apparatus includes one or more alignment apparatuses and/ or systems by which positions of marks on a substrate must be measured accurately. These alignment apparatuses are effectively position measuring apparatuses. Different types of marks and different types of alignment apparatuses and/or systems are known from different times and different manufacturers. A type of system widely used in current lithographic apparatus is based on a self-referencing interferometer as described in U.S. Pat. No. 6,961,116 (den Boef et al.), which is incorporated by reference herein in its entirety. Generally, marks are measured separately to obtain X- and Y-positions. A combined X- and Y-measurement may be performed using the techniques described in U.S. Publication No. 2009/195768 A (Bijnen et al.), which is also incorporated by reference herein in its entirety.

The terms "inspection apparatus," "metrology apparatus," and the like may be used herein to refer to, e.g., a device or system used for measuring a property of a structure (e.g., overlay error, critical dimension parameters) or used in a lithographic apparatus to inspect an alignment of a wafer (e.g., alignment apparatus).

Figure 4A:
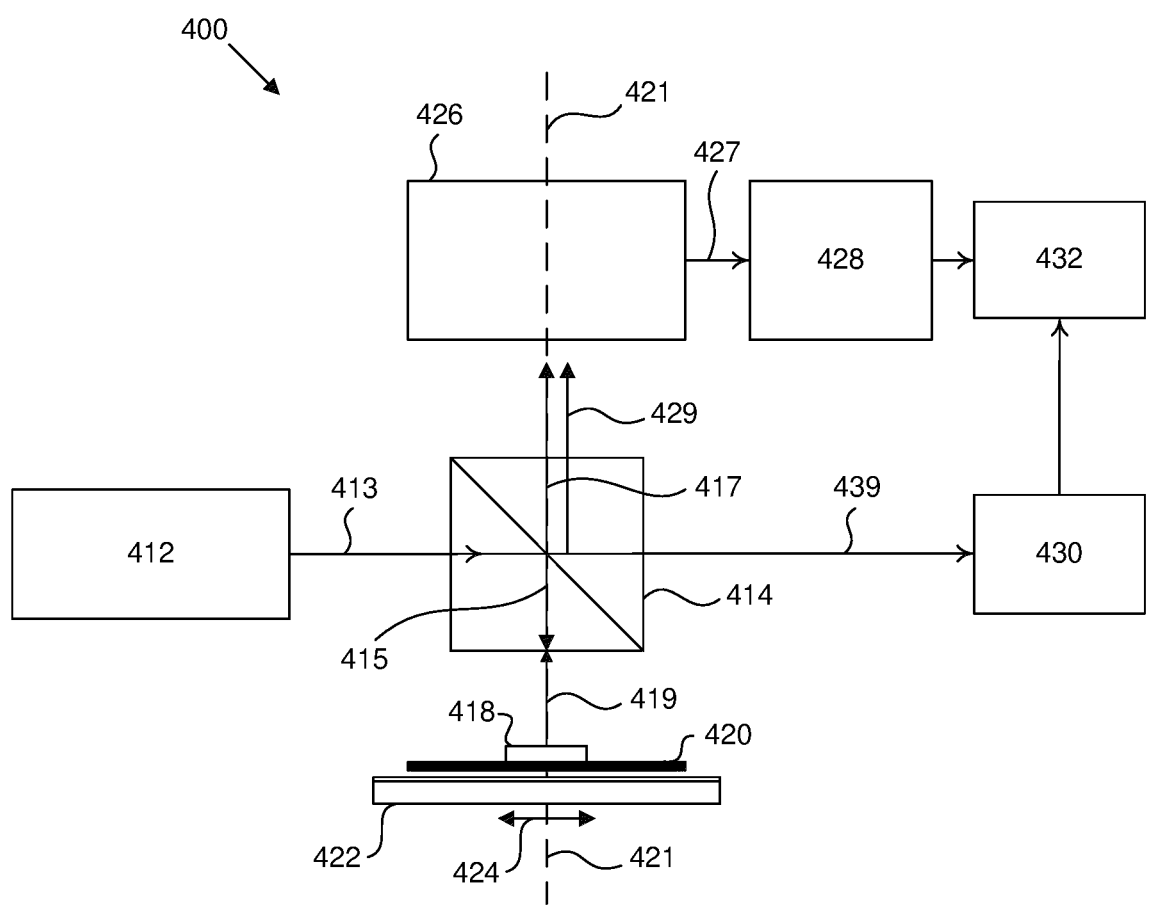
FIGS. 4A and 4B show schematics of alignment apparatuses, according to some embodiments.

FIG. 4A shows a schematic of a cross-sectional view of a metrology apparatus 400, according to some embodiments. In some embodiments, metrology apparatus 400 may be implemented as part of lithographic apparatus 100 or 100'. Metrology apparatus 400 may be configured to align a substrate (e.g., substrate W) with respect to a patterning device (e.g., patterning device MA). Metrology apparatus 400 may be further configured to detect positions of alignment marks on the substrate and to align the substrate with respect to the patterning device or other components of lithographic apparatus 100 or 100' using the detected positions of the alignment marks. Such alignment of the substrate may ensure accurate exposure of one or more patterns on the substrate.

In some embodiments, metrology apparatus 400 may include an illumination system 412, a beam splitter 414, an interferometer 426, a detector 428, a beam analyzer 430, and an overlay calculation processor 432. Illumination system 412 may be configured to provide an electromagnetic narrow band radiation beam 413 having one or more passbands. In an example, the one or more passbands may be within a spectrum of wavelengths between about 500 nm to about 900 nm. In another example, the one or more passbands may be discrete narrow passbands within a spectrum of wavelengths between about 500 nm to about 900 nm. Illumination system 412 may be further configured to provide one or more passbands having substantially constant center wavelength (CWL) values over a long period of time (e.g., over a lifetime of illumination system 412). Such configuration of illumination system 412 may help to prevent the shift of the actual CWL values from the desired CWL values, as discussed above, in current alignment systems. And, as a result, the use of constant CWL values may improve long-term stability and accuracy of alignment systems (e.g., metrology apparatus 400) compared to the current alignment apparatuses.

In some embodiments, beam splitter 414 may be configured to receive radiation beam 413 and split radiation beam 413 into at least two radiation sub-beams. For example, radiation beam 413 may be split into radiation sub-beams 415 and 417, as shown in FIG. 4A. Beam splitter 414 may be further configured to direct radiation sub-beam 415 onto a substrate 420 placed on a stage 422. In one example, the stage 422 is movable along direction 424. Radiation sub-beam 415 may be configured to illuminate an alignment mark or a target 418 located on substrate 420. Alignment mark or target 418 may be coated with a radiation sensitive film. In some embodiments, alignment mark or target 418 may have one hundred and eighty degrees (i.e., 180°) symmetry. That is, when alignment mark or target 418 is rotated 180° about an axis of symmetry perpendicular to a plane of alignment mark or target 418, rotated alignment mark or target 418 may be substantially identical to an unrotated alignment mark or target 418. The target 418 on substrate 420 may be a resist layer grating comprising bars that are formed of solid resist lines, a product layer grating, a composite grating stack in an overlay target structure comprising a resist grating overlaid or interleaved on a product layer grating, or the like. The bars may alternatively be etched into the substrate. This pattern may be sensitive to chromatic aberrations in the lithographic projection apparatus, particularly the projection system PL, and illumination symmetry and the presence of such aberrations may manifest themselves in a variation in the printed grating. In one example, an in-line method used in device manufacturing for measurements of line width, pitch, and critical dimension makes use of a technique known as "scatterometry". For example, methods of scatterometry are described in Raymond et al., "Multiparameter Grating Metrology Using Optical Scatterometry", J. Vac. Sci. Tech. B, Vol. 15, no. 2, pp. 361-368 (1997) and Niu et al., "Specular Spectroscopic Scatterometry in DUV Lithography", SPIE, Vol. 3677 (1999), which are both incorporated by reference herein in their entireties. In scatterometry, light is reflected by periodic structures in the target, and the resulting reflection spectrum at a given angle is detected. The structure giving rise to the reflection spectrum is reconstructed, e.g. using Rigorous Coupled-Wave Analysis (RCWA) or by comparison to a library of patterns derived by simulation. Accordingly, the scatterometry data of the printed gratings is used to reconstruct the gratings. The parameters of the grating, such as line widths and shapes, may be input to the reconstruction process, performed by processing unit PU, from knowledge of the printing step and/or other scatterometry processes.

In some embodiments, beam splitter 414 may be further configured to receive diffraction radiation beam 419 and split diffraction radiation beam 419 into at least two radiation sub-beams, according to an embodiment. Diffraction radiation beam 419 may be split into diffraction radiation sub-beams 429 and 439, as shown in FIG. 4A.

It should be noted that even though beam splitter 414 is shown to direct radiation sub-beam 415 towards alignment mark or target 418 and to direct diffracted radiation sub-beam 429 towards interferometer 426, the disclosure is not so limiting. It would be apparent to a person skilled in the relevant art that other optical arrangements may be used to obtain the similar result of illuminating alignment mark or target 418 on substrate 420 and detecting an image of alignment mark or target 418.

As illustrated in FIG. 4A, interferometer 426 may be configured to receive radiation sub-beam 417 and diffracted radiation sub-beam 429 through beam splitter 414. In an example embodiment, diffracted radiation sub-beam 429 may be at least a portion of radiation sub-beam 415 that may be reflected from alignment mark or target 418. In an example of this embodiment, interferometer 426 comprises any appropriate set of optical-elements, for example, a combination of prisms that may be configured to form two images of alignment mark or target 418 based on the received diffracted radiation sub-beam 429. It should be appreciated that a good quality image need not be formed, but that the features of alignment mark 418 should be resolved. Interferometer 426 may be further configured to rotate one of the two images with respect to the other of the two images 180° and recombine the rotated and unrotated images interferometrically.

In some embodiments, detector 428 may be configured to receive the recombined image via interferometer signal 427 and detect interference as a result of the recombined image when alignment axis 421 of metrology apparatus 400 passes through a center of symmetry (not shown) of alignment mark or target 418. Such interference may be due to alignment mark or target 418 being 180° symmetrical, and the recombined image interfering constructively or destructively, according to an example embodiment. Based on the detected interference, detector 428 may be further configured to determine a position of the center of symmetry of alignment mark or target 418 and consequently, detect a position of substrate 420. According to an example, alignment axis 421 may be aligned with an optical beam perpendicular to substrate 420 and passing through a center of image rotation interferometer 426. Detector 428 may be further configured to estimate the positions of alignment mark or target 418 by implementing sensor characteristics and interacting with wafer mark process variations.

In a further embodiment, detector 428 may determine the position of the center of symmetry of alignment mark or target 418 by performing one or more of the following measurements:

1. measuring position variations for various wavelengths (position shift between colors);
2. measuring position variations for various orders (position shift between diffraction orders); and/or
3. measuring position variations for various polarizations (position shift between polarizations).

This data may for example be obtained with any type of alignment sensor, for example a SMASH (SMart Alignment Sensor Hybrid) sensor, as described in U.S. Pat. No. 6,961,116 that employs a self-referencing interferometer with a single detector and four different wavelengths, and extracts the alignment signal in software, an ORION sensor, or Athena (Advanced Technology using High order ENhancement of Alignment), as described in U.S. Pat. No. 6,297,876, which directs each of seven diffraction orders to a dedicated detector, which are both incorporated by reference herein in their entireties.

In some embodiments, beam analyzer 430 may be configured to receive and determine an optical state of diffracted radiation sub-beam 439. The optical state may be a measure of beam wavelength, polarization, or beam profile. Beam analyzer 430 may be further configured to determine a position of stage 422 and correlate the position of stage 422 with the position of the center of symmetry of alignment mark or target 418. As such, the position of alignment mark or target 418 and, consequently, the position of substrate 420 can be accurately known with reference to stage 422. Alternatively, beam analyzer 430 may be configured to determine a position of metrology apparatus 400 or any other reference element such that the center of symmetry of alignment mark or target 418 can be known with reference to metrology apparatus 400 or any other reference element. Beam analyzer 430 may be a point or an imaging polarimeter with some form of wavelength-band selectivity. In some embodiments, beam analyzer 430 may be directly integrated into metrology apparatus 400, or connected via fiber optics of several types: polarization preserving single mode, multimode, or imaging, according to other embodiments.

In some embodiments, beam analyzer 430 may be further configured to determine the overlay data between two patterns on substrate 420. One of these patterns may be a reference pattern on a reference layer. The other pattern may be an exposed pattern on an exposed layer. The reference layer may be an etched layer already present on substrate 420. The reference layer may be generated by a reference pattern exposed on the substrate by lithographic apparatus 100 and/or 100'. The exposed layer may be a resist layer exposed adjacent to the reference layer. The exposed layer may be generated by an exposure pattern exposed on substrate 420 by lithographic apparatus 100 or 100'. The exposed pattern on substrate 420 may correspond to a movement of substrate 420 by stage 422. In some embodiments, the measured overlay data may also indicate an offset between the reference pattern and the exposure pattern. The measured overlay data may be used as calibration data to calibrate the exposure pattern exposed by lithographic apparatus 100 or 100', such that after the calibration, the offset between the exposed layer and the reference layer may be minimized.

In some embodiments, beam analyzer 430 may be further configured to determine a model of the product stack profile of substrate 420, and may be configured to measure overlay, critical dimension, and focus of target 418 in a single measurement. The product stack profile contains information on the stacked product such as alignment mark, target 418, substrate 420, or the like and may include mark process variation-induced optical signature metrology that is a function of illumination variation. The product stack profile may also include product grating profile, mark stack profile, mark asymmetry information, or the like. An example of beam analyzer 430 may be found in the metrology apparatus known as Yieldstar™, manufactured by ASML, Veldhoven, The Netherlands, as described in U.S. Pat. No. 8,706,442, which is incorporated by reference herein in its entirety. Beam analyzer 430 may be further configured to process information related to a particular property of an exposed pattern in that layer. For example, beam analyzer 430 may process an overlay parameter (an indication of the positioning accuracy of the layer with respect to a previous layer on the substrate or the positioning accuracy of the first layer with respective to marks on the substrate), a focus parameter, and/or a critical dimension parameter (e.g., line width and its variations) of the depicted image in the layer. Other parameters are image parameters relating to the quality of the depicted image of the exposed pattern.

In some embodiments, an array of detectors (e.g., sensor array 1006) may be connected to beam analyzer 430, and allow the possibility of accurate stack profile detection as discussed below. For example, detector 428 may be an array of detectors. For the detector array, a number of options are possible: a bundle of multimode fibers, discrete pin detectors per channel, or CCD or CMOS (linear) arrays. The use of a bundle of multimode fibers enables any dissipating elements to be remotely located for stability reasons. Discrete PIN detectors offer a large dynamic range but may require separate pre-amps. The number of elements is therefore limited. CCD linear arrays offer many elements that may be read-out at high speed and are especially of interest if phase-stepping detection is used.

Figure 4B:
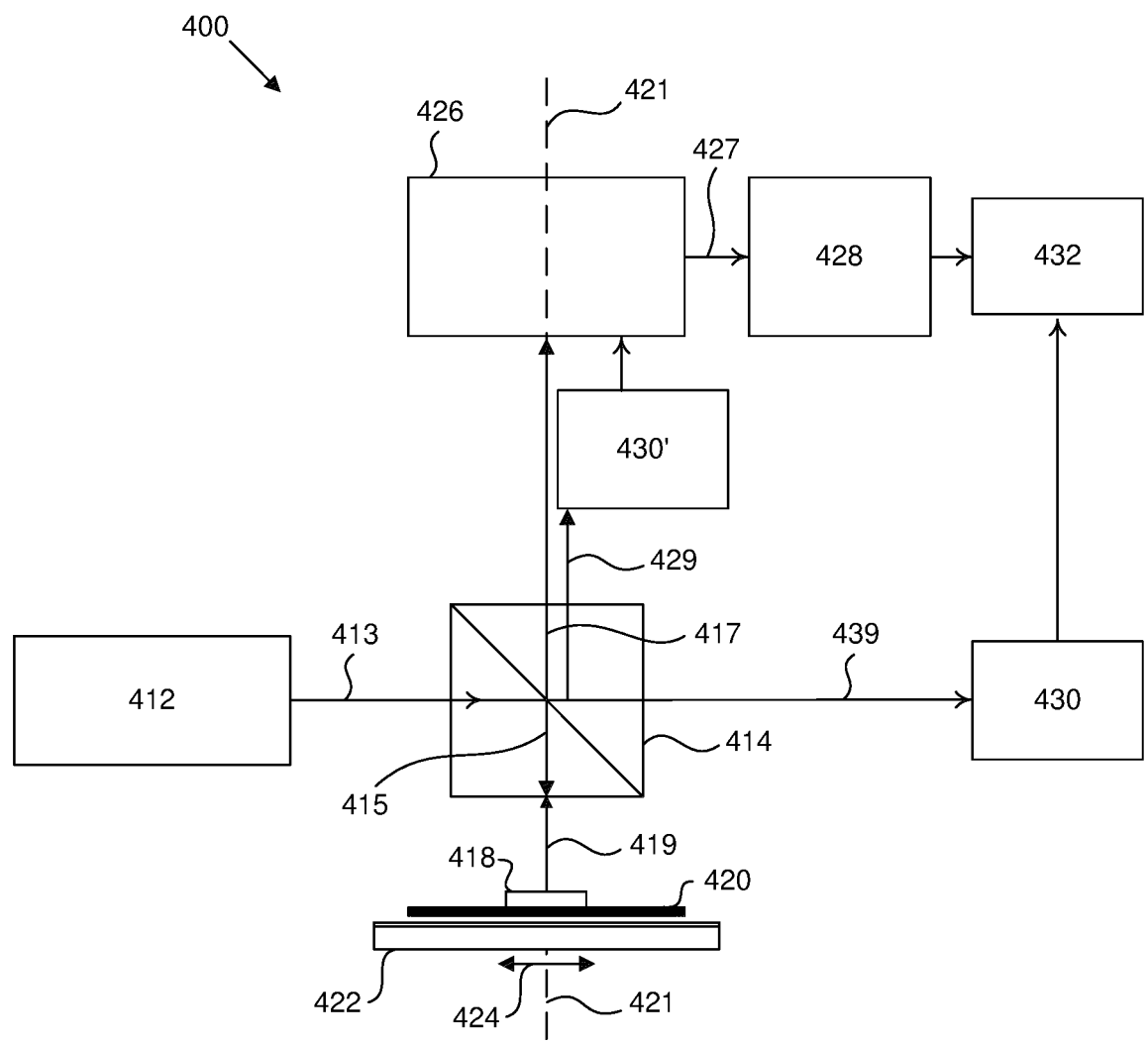

In some embodiments, a second beam analyzer 430' may be configured to receive and determine an optical state of diffracted radiation sub-beam 429, as shown in FIG. 4B. The optical state may be a measure of beam wavelength, polarization, beam profile, or the like. Second beam analyzer 430' may be identical to beam analyzer 430. Alternatively, second beam analyzer 430' may be configured to perform at least all the functions of beam analyzer 430, such as determining a position of stage 422 and correlating the position of stage 422 with the position of the center of symmetry of alignment mark or target 418. As such, the position of alignment mark or target 418 and, consequently, the position of substrate 420, can be accurately known with reference to stage 422. Second beam analyzer 430' may also be configured to determine a position of metrology apparatus 400, or any other reference element, such that the center of symmetry of alignment mark or target 418 may be known with reference to metrology apparatus 400, or any other reference element. Second beam analyzer 430' may be further configured to determine the overlay data between two patterns and a model of the product stack profile of substrate 420. Second beam analyzer 430' may also be configured to measure overlay, critical dimension, and focus of target 418 in a single measurement.

In some embodiments, second beam analyzer 430' may be directly integrated into metrology apparatus 400, or it may be connected via fiber optics of several types: polarization preserving single mode, multimode, or imaging, according to other embodiments. Alternatively, second beam analyzer 430' and beam analyzer 430 may be combined to form a single analyzer (not shown) configured to receive and determine the optical states of both diffracted radiation sub-beams 429 and 439.

In some embodiments, processor 432 receives information from detector 428 and beam analyzer 430. For example, processor 432 may be an overlay calculation processor. The information may comprise a model of the product stack profile constructed by beam analyzer 430. Alternatively, processor 432 may construct a model of the product mark profile using the received information about the product mark. In either case, processor 432 constructs a model of the stacked product and overlay mark profile using or incorporating a model of the product mark profile. The stack model is then used to determine the overlay offset and minimizes the spectral effect on the overlay offset measurement. Processor 432 may create a basic correction algorithm based on the information received from detector 428 and beam analyzer 430, including but not limited to the optical state of the illumination beam, the alignment signals, associated position estimates, and the optical state in the pupil, image, and additional planes. The pupil plane is the plane in which the radial position of radiation defines the angle of incidence and the angular position defines the azimuth angle of the radiation. Processor 432 may utilize the basic correction algorithm to characterize the metrology apparatus 400 with reference to wafer marks and/or alignment marks 418.

In some embodiments, processor 432 may be further configured to determine printed pattern position offset error with respect to the sensor estimate for each mark based on the information received from detector 428 and beam analyzer 430. The information includes but is not limited to the product stack profile, measurements of overlay, critical dimension, and focus of each alignment marks or target 418 on substrate 420. Processor 432 may utilize a clustering algorithm to group the marks into sets of similar constant offset error, and create an alignment error offset correction table based on the information. The clustering algorithm may be based on overlay measurement, the position estimates, and additional optical stack process information associated with each set of offset errors. The overlay is calculated for a number of different marks, for example, overlay targets having a positive and a negative bias around a programmed overlay offset. The target that measures the smallest overlay is taken as reference (as it is measured with the best accuracy). From this measured small overlay, and the known programmed overlay of its corresponding target, the overlay error may be deduced. Table 1 illustrates how this may be performed. The smallest measured overlay in the example shown is −1 nm. However, this is in relation to a target with a programmed overlay of −30 nm. Consequently, the process has introduced an overlay error of 29 nm.

TABLE 1

| Programmed overlay | −70 | −50 | −30 | −10 | 10 | 30 | 50 |
|---|---|---|---|---|---|---|---|
| Measured overlay | −38 | −19 | −1 | 21 | 43 | 66 | 90 |
| Difference between measured and programmed overlay | 32 | 31 | 29 | 31 | 33 | 36 | 40 |
| Overlay error | 3 | 2 | — | 2 | 4 | 7 | 11 |

The smallest value may be taken to be the reference point and, relative to this, the offset may be calculated between measured overlay and that expected due to the programmed overlay. This offset determines the overlay error for each mark or the sets of marks with similar offsets. Therefore, in the Table 1 example, the smallest measured overlay was −1 nm, at the target position with programmed overlay of 30 nm. The difference between the expected and measured overlay at the other targets is compared to this reference. A table such as Table 1 may also be obtained from marks and target 418 under different illumination settings, the illumination setting, which results in the smallest overlay error, and its corresponding calibration factor, may be determined and selected. Following this, processor 432 may group marks into sets of similar overlay error. The criteria for grouping marks may be adjusted based on different process controls, for example, different error tolerances for different processes.

In some embodiments, processor 432 may confirm that all or most members of the group have similar offset errors, and apply an individual offset correction from the clustering algorithm to each mark, based on its additional optical stack metrology. Processor 432 may determine corrections for each mark and feed the corrections back to lithographic apparatus 100 or 100' for correcting errors in the overlay, for example, by feeding corrections into the alignment apparatus 400.

Figure 5:
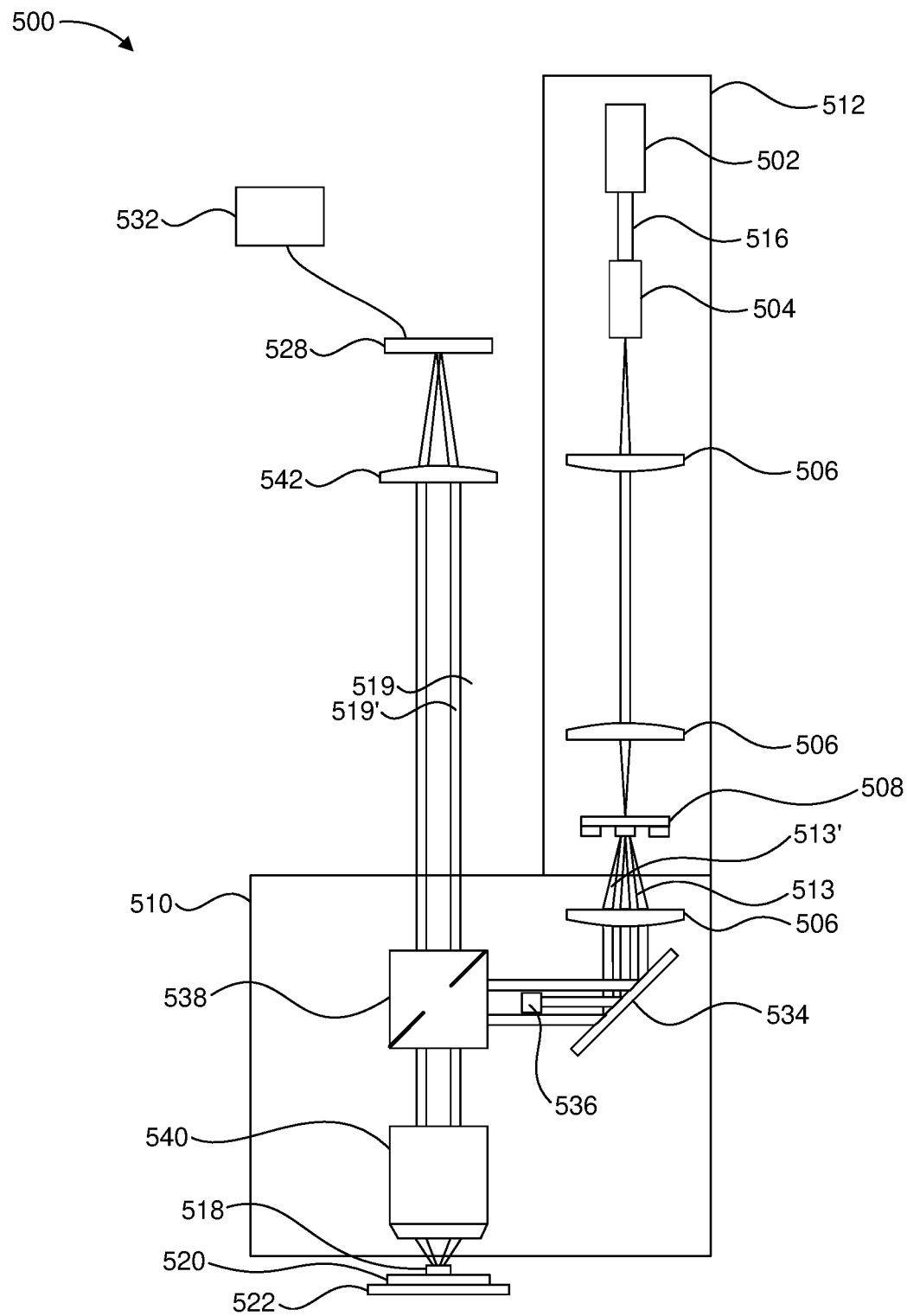
FIG. 5 shows a system, according to some embodiments.

FIG. 5 shows a system 500, according to some embodiments. In some embodiments, system 500 can also represent a more detailed view of inspection apparatus 400 (FIGS. 4A and 4B). For example, FIG. 5 illustrates a more detailed view of illumination system 412 and its functions. Unless otherwise noted, elements of FIG. 5 that have similar reference numbers (e.g., reference numbers sharing the two right-most numeric digits) as elements of FIGS. 4A and 4B can have similar structures and functions.

In some embodiments, system 500 comprises an illumination system 512, an optical system 510, a detector 528, and a processor 532. Illumination system 512 can comprise a radiation source 502, an optical fiber 504 (e.g., a multimode fiber), an optical element(s) 506 (e.g., a lens or lens system), and a diffractive element 508 (e.g., a grating, adjustable grating, and the like). Optical system 510 can comprise one or more of optical element 506, a blocking element 536, a reflective element 538 (e.g., spot mirror), a reflective element 534, and an optical element 540 (e.g., an objective lens). FIG. 5 shows a non-limiting depiction of system 500 inspecting a target 518 (also "target structure") on a substrate 520. The substrate 520 is disposed on a stage 522 that is adjustable (e.g., a support structure that can move). It should be appreciated the structures drawn within illumination system 512 and optical system 510 are not limited to their depicted positions. For example, diffractive element 508 can be within optical system 510. The positions of structures can vary as necessary, for example, as designed for a modular assembly.

In some embodiments, radiation source 502 can generate radiation 516. Radiation 516 can be spatially incoherent. Since the output of radiation source 502 may not be pointed directly toward downstream optical structures, optical fiber 504 can guide radiation 516 to downstream optical structures. Optical element(s) 506 can direct or condition radiation 516 (e.g., focus, collimate, make parallel, and the like). Diffractive element 508 can diffract radiation 516 to generate beams of radiation 513 and 513' (also first and second beams of radiation). Beam of radiation 513 can comprise a first non-zero diffraction order from diffractive element 508 (e.g., +1 order). Beam of radiation 513' can comprise a second non-zero diffraction order from diffractive element 508 (e.g., −1 order) that is different from the first non-zero diffraction order. Diffractive element 508 can also generate a zeroth order beam (not labeled). Blocking element 536 can block the zeroth order beam to allow darkfield measurements. Spot mirror directs beams of radiation 513 and 513' toward target 518. Optical element 540 focuses beams of radiation 513 and 513' onto target 518 such that illumination spots of both beams overlap. The illumination spots can underfill or overfill target 518.

In some embodiments, target 518 can comprise a diffractive structure (e.g., a grating(s) as shown in FIG. 5). Target 518 can reflect, refract, diffract, scatter, or the like, radiation. For ease of discussion, and without limitation, radiation that interacts with a target will be termed scattered radiation throughout. Target 518 can scatter incident radiation, which is represented by scattered beams of radiation 519 and 519' (also first and second scattered beams of radiation). Scattered beam of radiation 519 can represent radiation from beam of radiation 513 that has been scattered by target 518. Similarly, scattered beam of radiation 519' can represent radiation from beam of radiation 513' that has been scattered by target 518. Optical element 542 focuses scattered beams of radiation 519 and 519' such that scattered beams of radiation 519 and 519' interfere at detector 528. Optical element 540 directs beams of radiation 513 and 513' such that they are incident on target 518 at non-zero incidence angles (e.g., off-axis). Detector 528 can generate a detection signal based on having received scattered beams of radiation 519 and 519'. Detector 528 can be an imaging detector (e.g., CCD, CMOS, or the like). In this scenario, the detection signal can comprise a digital or analog representation of an image comprising the interference pattern, which are sent to processor 532.

In some embodiments, processor 532 can analyze the detection signal to determine a property of target 518. It should be appreciated that the measurement process can be different depending on the specific property of target 518 being determined. For example, in the case where the property of target 518 being determined is an alignment position, a measurement is performed on target 518 alone. In another example, in the case where the property of target 518 being determined is an overlay error, the measurement compares target 518 to a second target. Overlay error determination is a process that compares a first target (on a first layer of fabrication) to a second target (on a second layer of fabrication that is different from the first layer) and determines whether the first and second layers are properly overlayed on top of each other. The first and second targets can be, for example, stacked on top of each other or fabricated side-by-side. Determination of other properties of target 518, from either target 518 alone or in conjunction with another target, can be envisaged (e.g., line width, pitch, critical dimension, and the like). Moreover, while beams of radiation 513 and 513' are described above as both being incident on target 518 (i.e., alignment measurement), embodiments can be envisaged where a beam of radiation is directed to another target to allow, for example, overlay error measurements. For example, beams of radiation 513 and/or 513' can be replicated (e.g., using a beam splitter) for sending to another target.

In some embodiments, analysis performed by processor 532 can be based on target 518 having been irradiated by beams of radiation 513 and 513' (e.g., alignment measurement), which have different diffraction orders (e.g., +1 and −1). The analysis comprises, for example, performing a mathematical fit to the Moiré pattern (e.g., fitting a sine function along the direction of the pitch of the Moiré pattern). Using the information inferred from the mathematical fit, the determined property of target 518 can be improved and made more accurate. This technique reduces the impact of factors that reduce accuracy of measurements, for example, finite size effects, presence of higher diffraction orders, imperfections in gratings and optics, and the like. It should be appreciated that the mathematical fit is performed on a still image. For example, regions of interest may be selected on target 518 and/or detected pixels may be assigned weighting to enhance accuracy and robustness of measurement. This is described in more detail in PCT/EP2019/072762, filed on Aug. 27, 2019, which is incorporated by reference herein in its entirety.

In wafer alignment metrology, measurement of multiple colors is important to be able to correct for mark asymmetries and/or capture other irregularities. Some camera based systems (e.g., system 500 of FIG. 5 or Yieldstar™ may measure colors sequentially. In some embodiments, sequential measurement of M colors means shorter integration time (T/M) per color compared to a parallel case (i.e., color measured in parallel) at an identical throughput. In some embodiments, the shorter integration time may make the sequential scheme more susceptible to errors in wafer stage position (SPM error).

Figure 6:
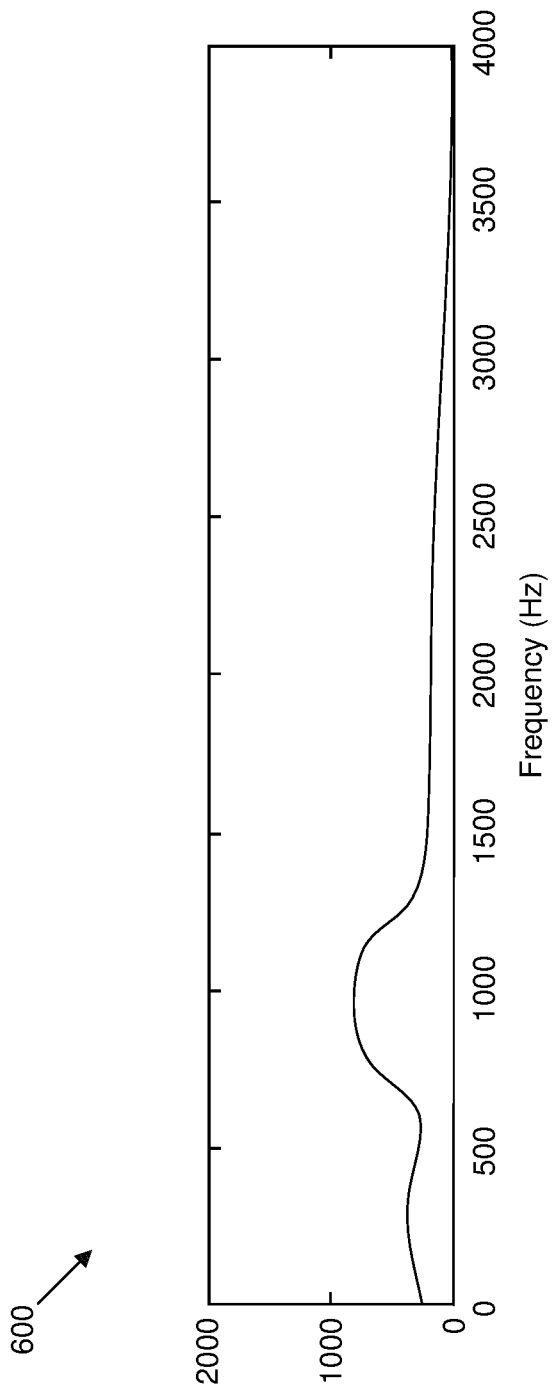
FIG. 6 shows a spectrum of errors in stage positioning measurements (SPM), in accordance with some embodiments.

FIG. 6 shows a spectrum of errors in SPM measurements, in accordance with some embodiments. As shown in schematic 600, the error at low frequencies (0-500 Hz) is larger than the error at higher frequencies (>1500 Hz).

Figure 7:
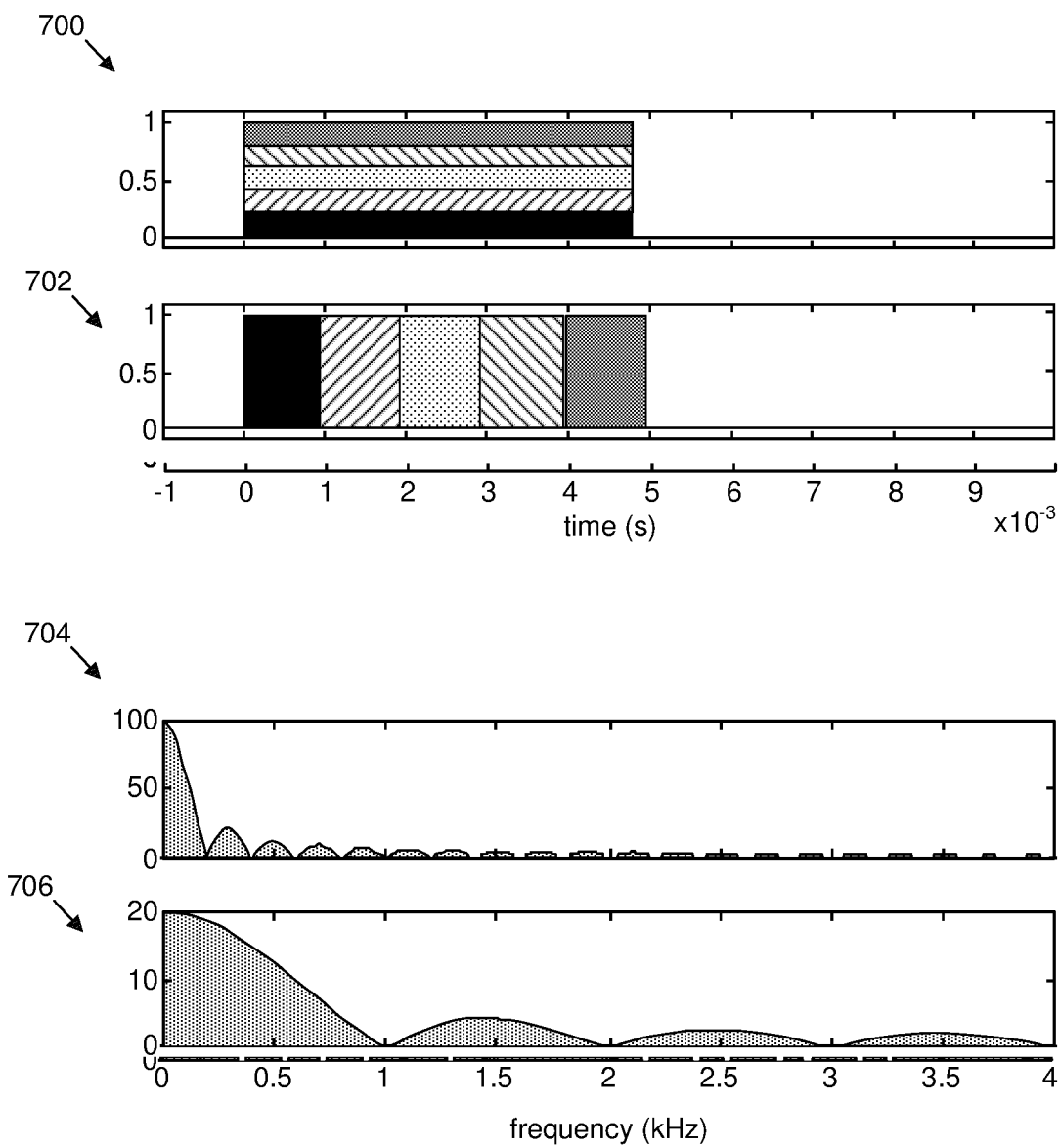
FIG. 7 shows integration times and corresponding transfer function for parallel and sequential illumination, according to some embodiments.

FIG. 7 shows integration times and corresponding transfer function for parallel and sequential illumination, according to some embodiments. For example, schematic 700 shows the integration times for parallel illumination. In some embodiments, the integration time is 5 ms for each wavelength (each color). Schematic 702 shows the integration times for sequential illumination. Sequential illumination includes illuminating a target structure with radiation at a first wavelength (i.e., a first illumination shot), followed with radiation at a second wavelength, and the like. In some embodiments, the integration time is 1 ms for each wavelength of the five wavelengths. In some embodiments, the total integration time for parallel illumination and for sequential illumination may be identical. Schematic 704 shows the transfer function of stage errors into measurement errors for the parallel illumination and schematic 706 shows the transfer function for the sequential illumination. For examples using parallel illumination, an integration time of 5 ms results in a transfer function that quickly falls off. In some embodiments, for smaller integration times (1 ms), the transfer function falloff is much slower, and therefore probe more of the low frequency components (which have larger errors).

In some embodiments, upon reducing integration time, the signal becomes more susceptible to low-frequency errors in any dynamical system where there are resonances. Furthermore, there can also be multiple resonances in the system.

Described herein are methods and systems to optimize a fast-sequential color/polarization illumination scheme in which each color and/or polarization may be turned on multiple times for a very short time in such a way that robustness to machine dynamics is maximized.

In some embodiments, an integration time associated with a first wavelength can be split into multiple (N) measurement shots (or illumination shots). In some aspects, a 1 ms integration time can be spread over the entire measurement time (e.g., 5 ms).

Figure 8:
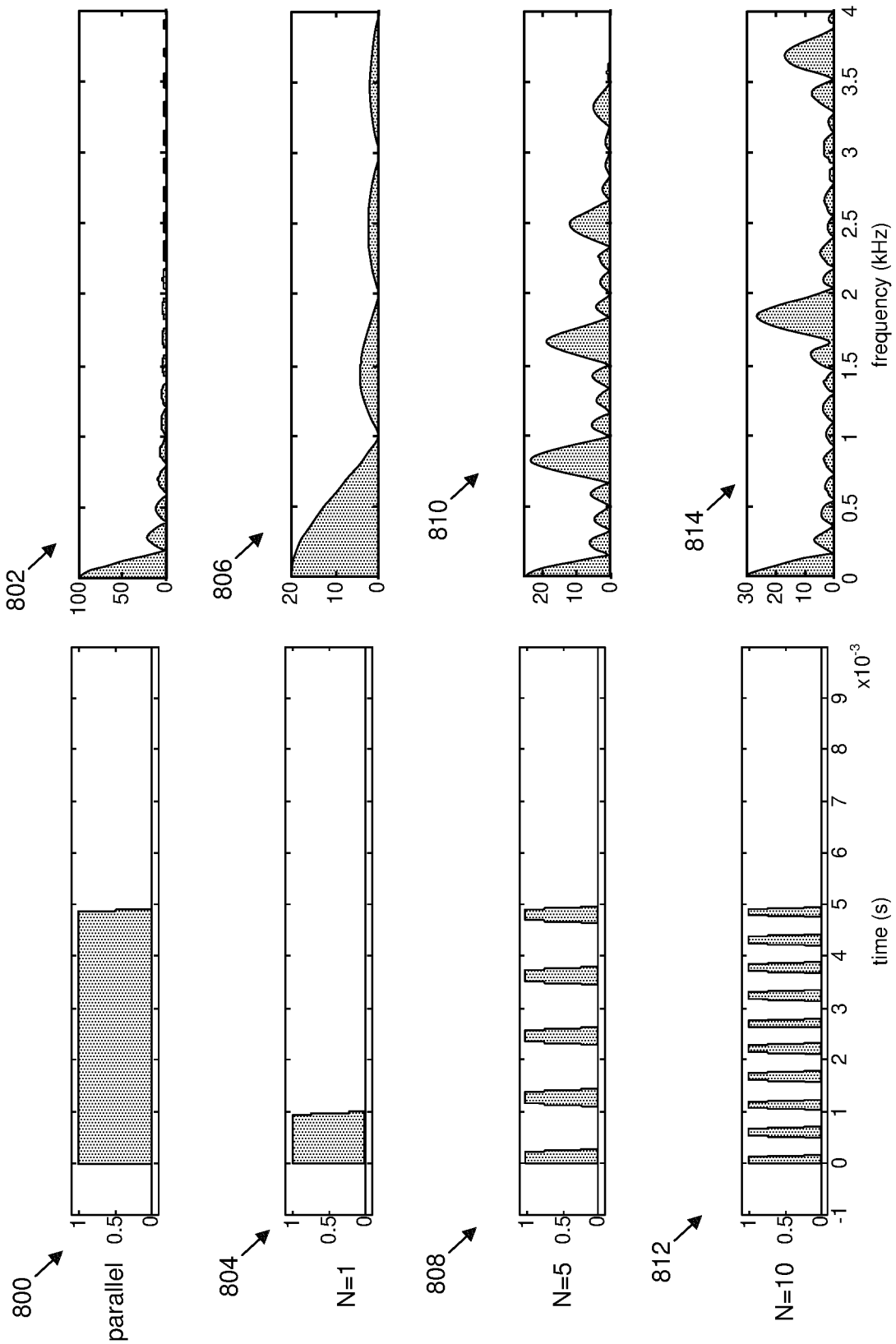
FIG. 8 shows integration times for multiple measurement cases, according to some embodiments.

FIG. 8 shows integration times for multiple measurement cases, according to some embodiments. Schematic 800 shows the integration time for parallel illumination. Schematic 802 shows the transfer function for parallel illumination. Schematic 804 shows the integration time for a single measurement (N=1). Schematic 806 shows the corresponding transfer function for N=1. Schematic 808 shows the integration times for multiple measurements (N=5). The 1 ms integration time can be split into 5 measurement shots. Each measurement shot has an integration time smaller than 1 ms. Schematic 810 shows the corresponding transfer function for N=5. As shown in schematic 810, the transfer function falls off steeply at low frequencies similar to the parallel case. Schematic 812 shows the integration times for multiple measurements (N=10). The corresponding transfer function is shown in schematic 814.

In some embodiments, the repetitive shots can inherently introduce a revival of the transfer curve at larger frequencies (e.g., for N=5 around 800 Hz). The frequency at which the revival happens can be tuned by adjusting the number of divisions N. In some aspects, the transfer function is tuned to shift into the region of larger frequencies where the error is smaller. Thus, the transfer function is less sensitive to the SPM errors and/or other errors.

Figure 9:
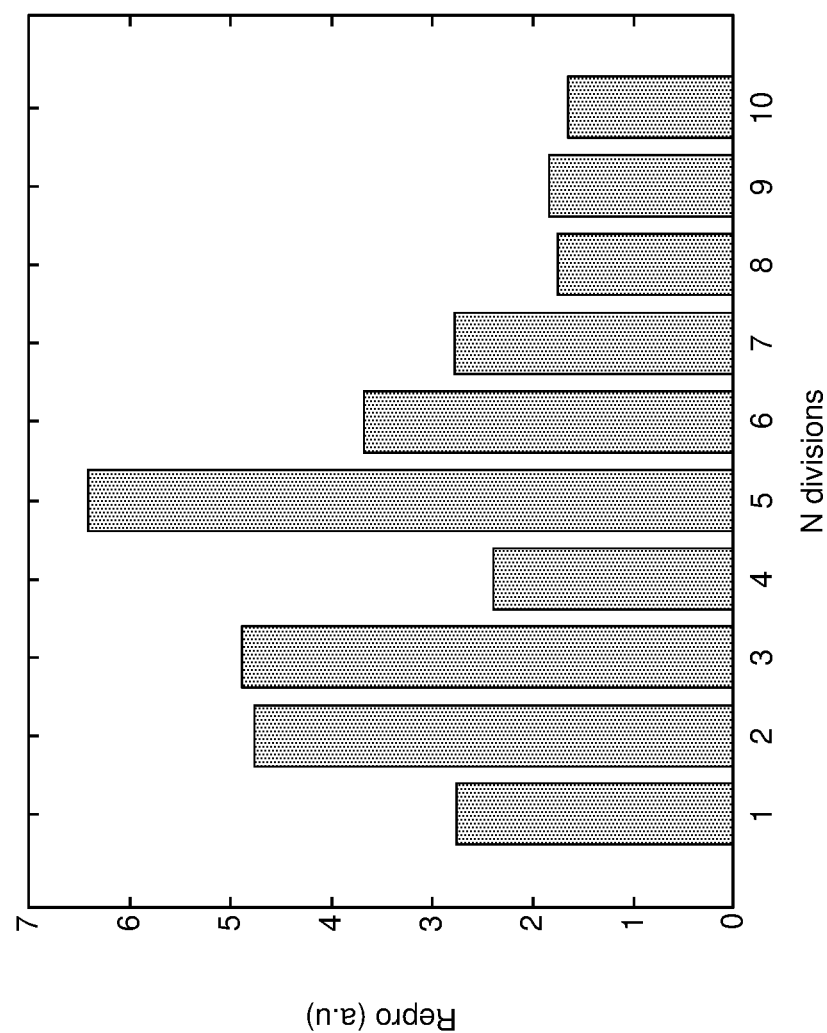
FIG. 9 shows the reproducibility error as a function of number shots within a time period, according to some embodiments.

FIG. 9 shows the reproducibility error as a function of number shots within a time period, according to some embodiments. Schematic 900 shows an improvement in the reproducibility error. For example, the repro for N=10 is better than the repro for N=1 (no division).

In some aspects, the time between the shots can be used to illuminate the target structure with illumination shots (e.g., radiation) having other properties (e.g., a different wavelength and/or polarization). In some embodiments, an integration time of each color can be divided in a similar manner, and interdigitated with each other.

Figure 10:
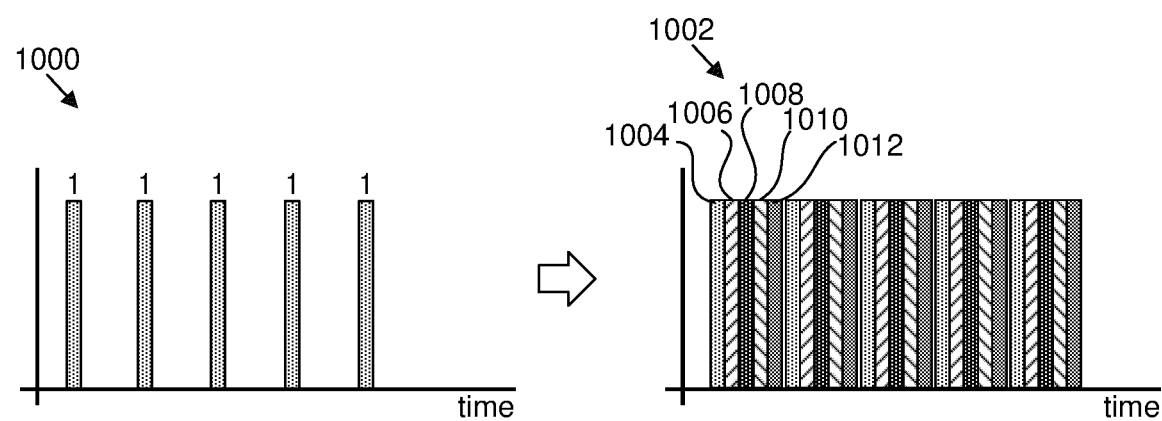
FIG. 10 shows sequential illumination shots, according to some embodiments.

FIG. 10 shows sequential (or interdigitated) illumination shots, according to some embodiments. In some embodiments, schematic 1000 shows multiple measurements using illumination shots having a first characteristic (e.g., at a first wavelength). In some embodiments, extending measurement to other wavelengths (colors) is done by shifting the other wavelengths in time. In some embodiments, schematic 1002 shows multiple measurements using illumination shots having different characteristics (e.g., different wavelength). In some aspects, the integration time associated with each wavelength can be split into two or more integration times. A target structure (e.g., target structure 518 of FIG. 5) is illuminated by a sequence of illuminations shots. The sequence of illuminations shots includes illuminating the target structure with radiation having different wavelengths and/or polarization sequentially. In some aspects, the target structure may be illuminated by a first illumination shot at a first wavelength 1004, followed by a second illumination shot at a second wavelength 1006, followed by a third illumination shot at a third wavelength 1008, followed by a fourth illumination shot at a fourth wavelength 1010, and followed by a fifth illumination shot at a fifth wavelength 1012. Then, the sequence can be repeated for the duration of the measurement. Thus, the reproducibility error at each wavelength is decreased.

In some embodiments, in case of splitting the integration time of a single wavelength to N=10 individual shots, each shot may have an integration time of 0.1 ms and a camera frame rate of 10.000 is sufficient. In some aspects, changing the wavelength of the radiation beam can be done using an acousto-optic tunable filter (AOTF) device (in 10 μs). In some aspects, approximately 0.5 ms may be lost due to the switching between colors.

In some embodiments, an integration time associated with a first wavelength may be spread over the measurement period and the other wavelengths are measured in between the multiple measurement shots associated with the first wavelength. Thus, only a measurement shot associated with the first wavelength is divided into multiple measurement (illumination) shots having a short duration (fast). The others wavelengths are measured in between the shots of the first wavelength. In some aspects, data from a first measurement at a first wavelength may be used to probe stage dynamics. The stage dynamics for a second wavelength can be interpolated from the stage dynamics determined at the first wavelength. For example, difference in different positions in images obtained from the illumination shots at a first wavelength may be used to interpolate an error due to stage dynamics at other wavelengths. In some aspects, the repetition rate of the first wavelength may be double a resonance in the system.

Figure 11:
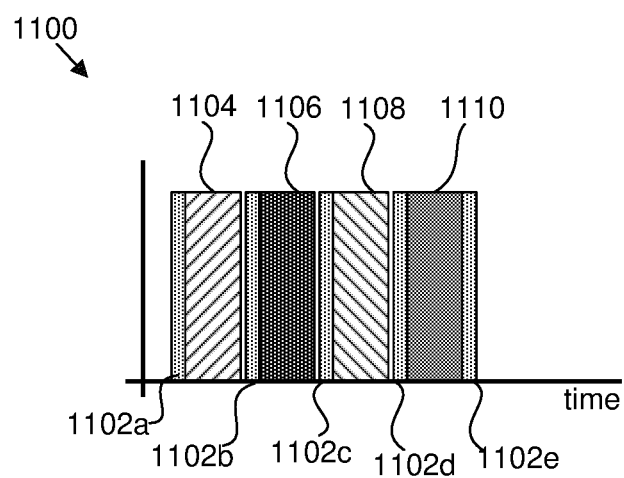
FIG. 11 shows sequential illumination shots using multiple wavelengths, according to some embodiments.

FIG. 11 shows sequential illumination shots using multiple wavelengths, according to some embodiments. In some embodiments, a single color is spread across the measurement period and the other colors are measured in between. As shown in schematic 1100, a first color may be split into five measurements shots (i.e., shots 1102a, 1102b, 1102c, 1102d, and 1102e). A second illumination shot 1104 having a second characteristic is measured in between shot 1102a and 1102b. A third illumination shot 1106 having a third characteristic may be measured between shot 1102b and shot 1102c. A fourth illumination shot 1108 having a fourth characteristic may be measured between shot 1102c and shot 1102d. In some aspects, a fifth illumination shot 1110 having a fifth characteristic may be measured between shot 1102d and 1102e. In some aspects, second illumination shot 1104, third illumination shot 1106, fourth illumination shot 1108, and fifth illumination shot 1110 may be at wavelengths different from each other.

In some embodiments, a reference illumination beam having a first characteristic (e.g., color 1) may be split into a multiple measurement shots captured on a first detector. Remaining illumination characteristics (e.g., color 2, color 3, color 4, color 5, and color 6) may be measured in parallel on a second detector with the same integration time per measurement. In some aspects, data from the spread measurement (i.e., color 1) may be used to correct the other colors for any machine dynamics spectrum. In some aspects, two images may be captured in parallel. In some embodiments, the two images may be captured on a single detector using a dichroic filter and mirrors.

In some embodiments, a reference illumination beam having a first characteristic may be illuminated from another reference. For example, if the sensor is deforming itself, another reference illumination (e.g., another reference mark, a mirror) may be used next to the objective lens.

In some embodiments, illumination having different characteristics may be stacked in pairs.

Figure 12:
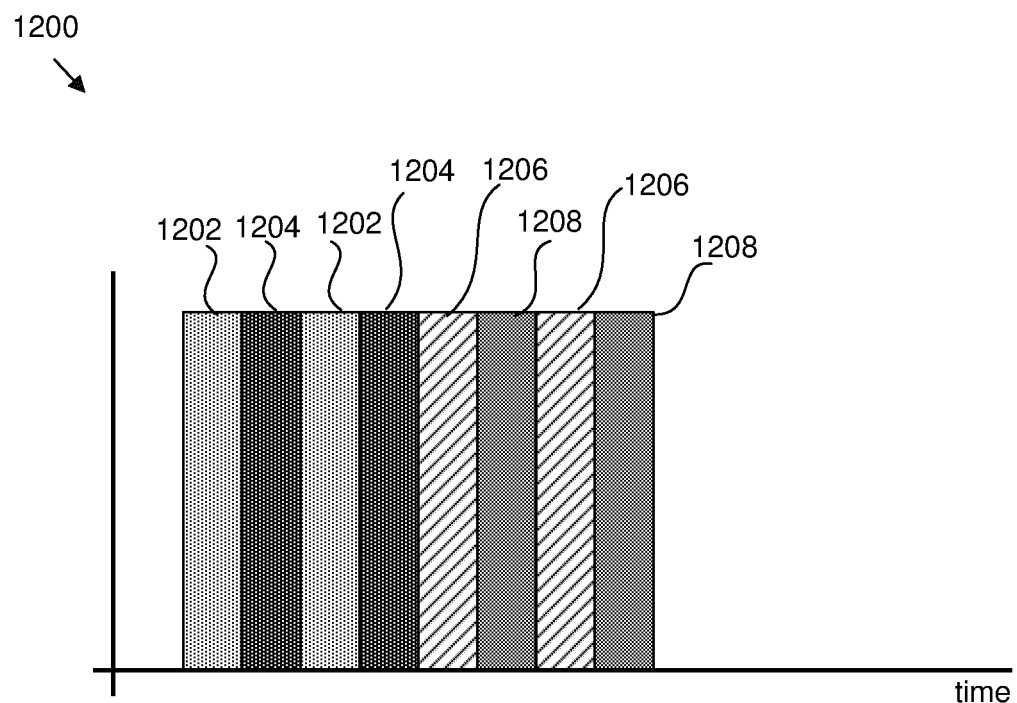
FIG. 12 shows stacked illumination shots using multiple wavelengths, according to some embodiments.

FIG. 12 shows stacked illumination shots using multiple wavelengths, according to some embodiments. In some embodiments, two or more of the colors may alternate for a first portion of the measurement time and two different colors may alternate for a second portion (e.g., remaining portion) of the measurement time. In some aspects, each illumination may be split into two shots. In some embodiments, shot 1202 having a first characteristic (e.g., at a first wavelength) may alternate with shot 1204 having a second characteristic (e.g., at a second wavelength) for a first period. Then, shot 1206 having a third characteristic (e.g., at a third wavelength) may alternate with shot 1208 having a fourth characteristic (e.g., at a fourth wavelength). In some aspects, a sequence of illumination shots can be shot 1202, shot 1204, shot 1202, shot 1204, shot 1206, shot 1208, shot 1206, and shot 1208.

In one example, an integration time of 0.25 ms per shot may be used. The sequence can have a transfer curve dip at about 1 KHz. In some aspects, ten different characteristics (e.g., colors, polarizations) can be measured within an integration time of 5 ms. In some aspects, a frame rate of 4000 fps is used for detector 528 of FIG. 5.

In some embodiments, non-even intervals may be used. In some aspects, spacing between illumination shots may be optimized to remove spectral weight around a desired frequency (e.g., 1 KHz or other frequencies).

Figure 13:
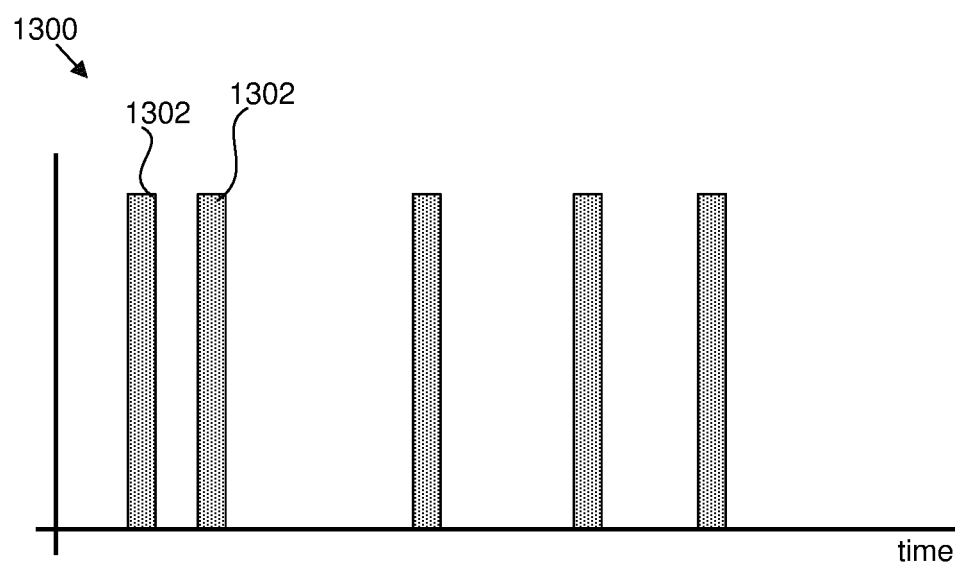
FIG. 13 shows illumination shots having non-even intervals, according to some embodiments.

FIG. 13 shows illumination shots having non-even intervals, according to some embodiments. As shown in schematic 1300, illumination shots 1302 may have non-even intervals in between the illumination shots 1302. In other words, a time period between two illumination shots 1302 may be non-equal to another time period between another two illumination shots 1302. In some aspects, a binary pattern associated with shots 1302 (i.e., distances between illumination shots) may be optimized so the spectral weight is zero around a desired frequency (e.g., 1 KHz). In some embodiments, the binary pattern associated with the shots 1302 is optimized so that the Fourier transform is proportional to the inverse of the SPM spectrum (large where SPM is low and vice versa). In some embodiments, illumination shots at another wavelength may be irradiated between illumination shots 1302.

In some embodiments, an intensity of each illumination shot may be varied.

Figure 14:
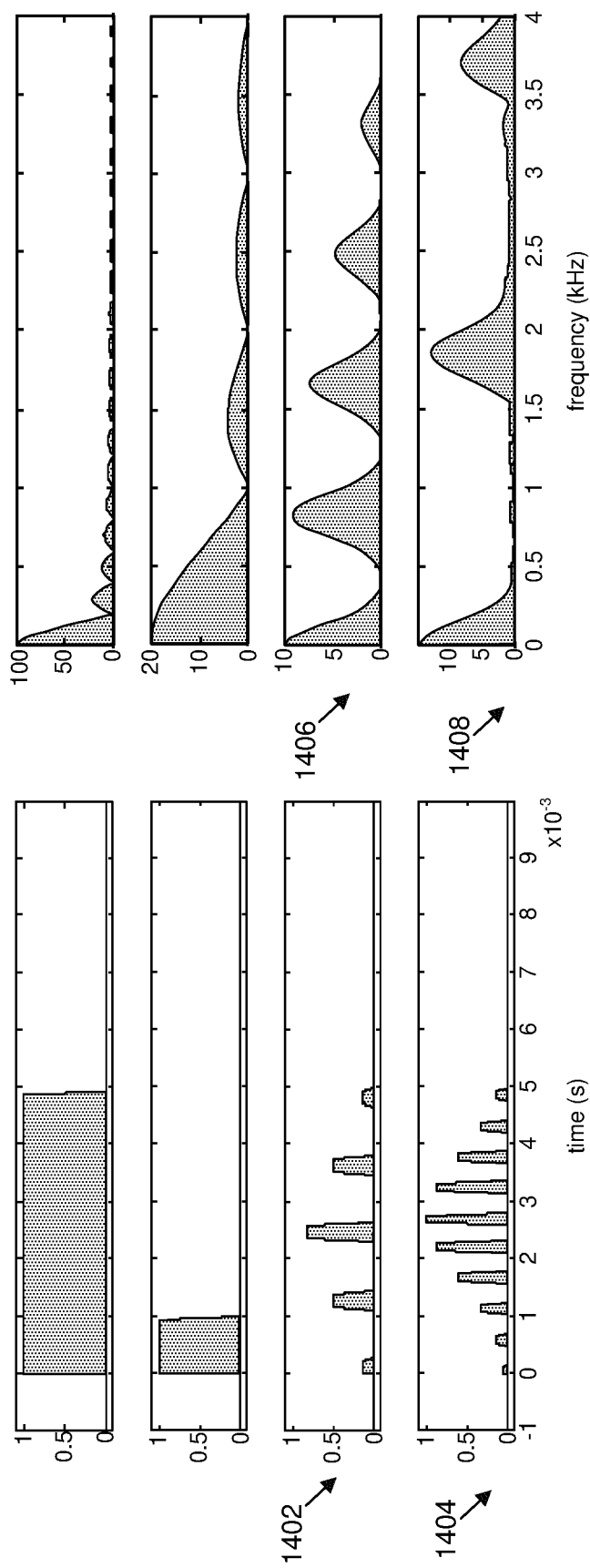
FIG. 14 shows integration times for multiple measurement cases, according to some embodiments.

FIG. 14 shows integration times for multiple measurement cases, according to some embodiments. In some embodiments, each shot can be assigned an individual intensity as shown in graph 1402 and graph 1404. This provides more control over the shape of the transfer function obtained. Graph 1402 shows the measurement time for N=5. Graph 1404 shows the measurement time for N=10. Graph 1402 and graph 1404 show a simple Gaussian envelope. In some aspects, other envelopes may be used. Graph 1406 and graph 1408 show the corresponding transfer function for graph 1402 and graph 1404, respectively. In some aspects, the zero-crossing in the transfer function may be adjusted to be smoother. As shown in graph 1406 and graph 1408, ripples around 1 KHz are attenuated compared with graph 810 and graph 814 (constant intensity is used for all the illumination shots).

In some embodiments, the intensity of the shots may be adjusted by the illumination system (e.g., illumination system 512 of FIG. 5). However, this may reduce the number of photons captured. Thus, there is a trade-off between worse reproducibility due to less photons and better reproducibility by quenching wafer stage position errors (SPM noise).

In some embodiments, the intensity of the shots may be adjusted during the analyzing of the detected signals (i.e., in post-processing by processor 532 of FIG. 5). In some aspects, all illumination shots may be irradiated with equal intensities toward the target structure. In some aspects, different weights may be assigned to individual shots during post-processing.

In some embodiments, intensity switching can be done with an acousto-optic tunable filter (AOTF) together with color switching in about 10 is.

Figure 15:
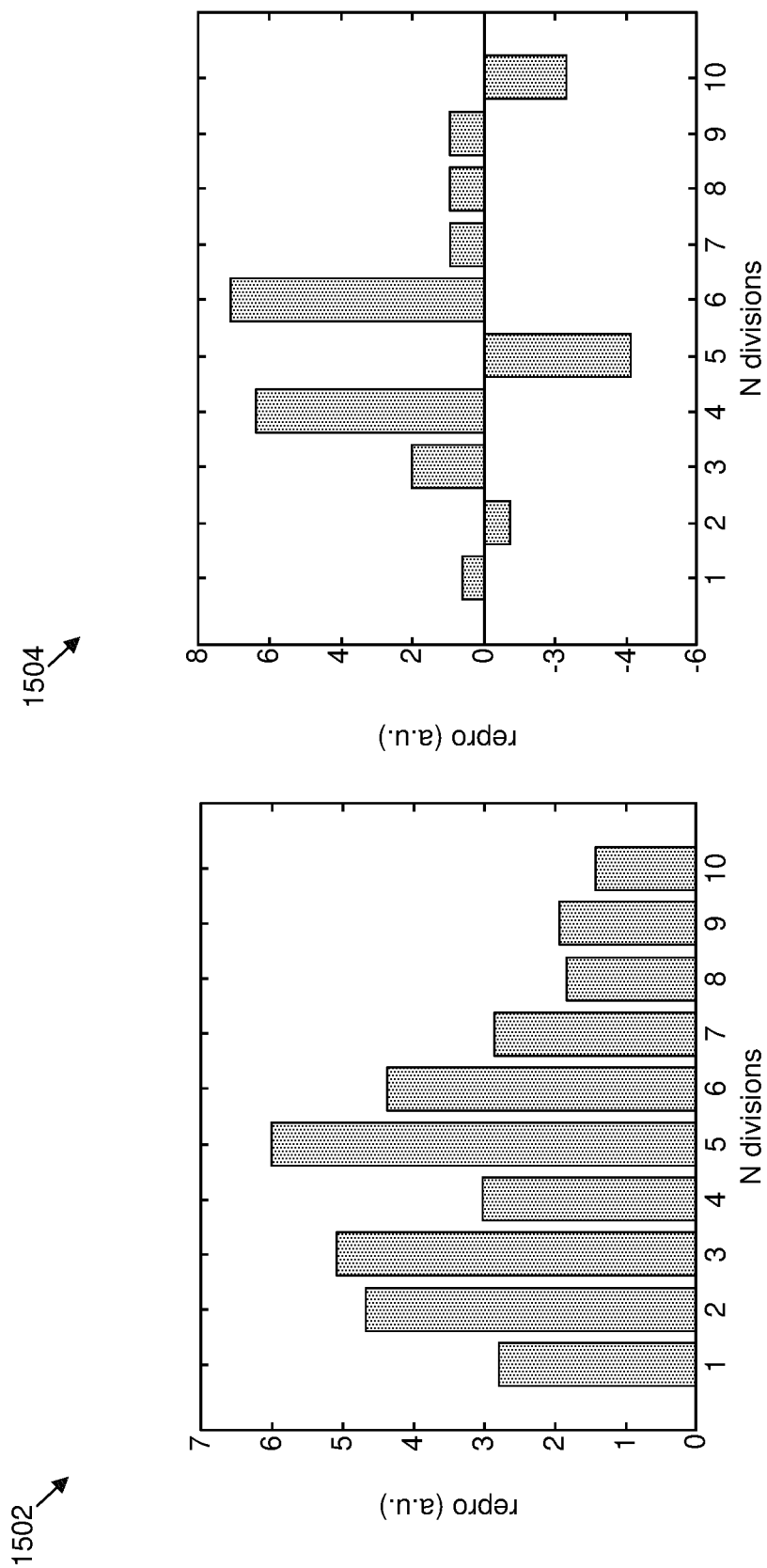
FIG. 15 shows the reproducibility error as a function of number of apodized shots, according to some embodiments.

FIG. 15 shows the reproducibility error using apodized illumination shots, according to some embodiments. Schematic 1502 shows the reproducibility improvement over an integration time of 1 ms when using apodization as a function of number shots within a time period. Schematic 1504 shows the improvement over fixed intensity shots. For N=10, apodization of the intensity perform may be better than without apodization.

Figure 16:
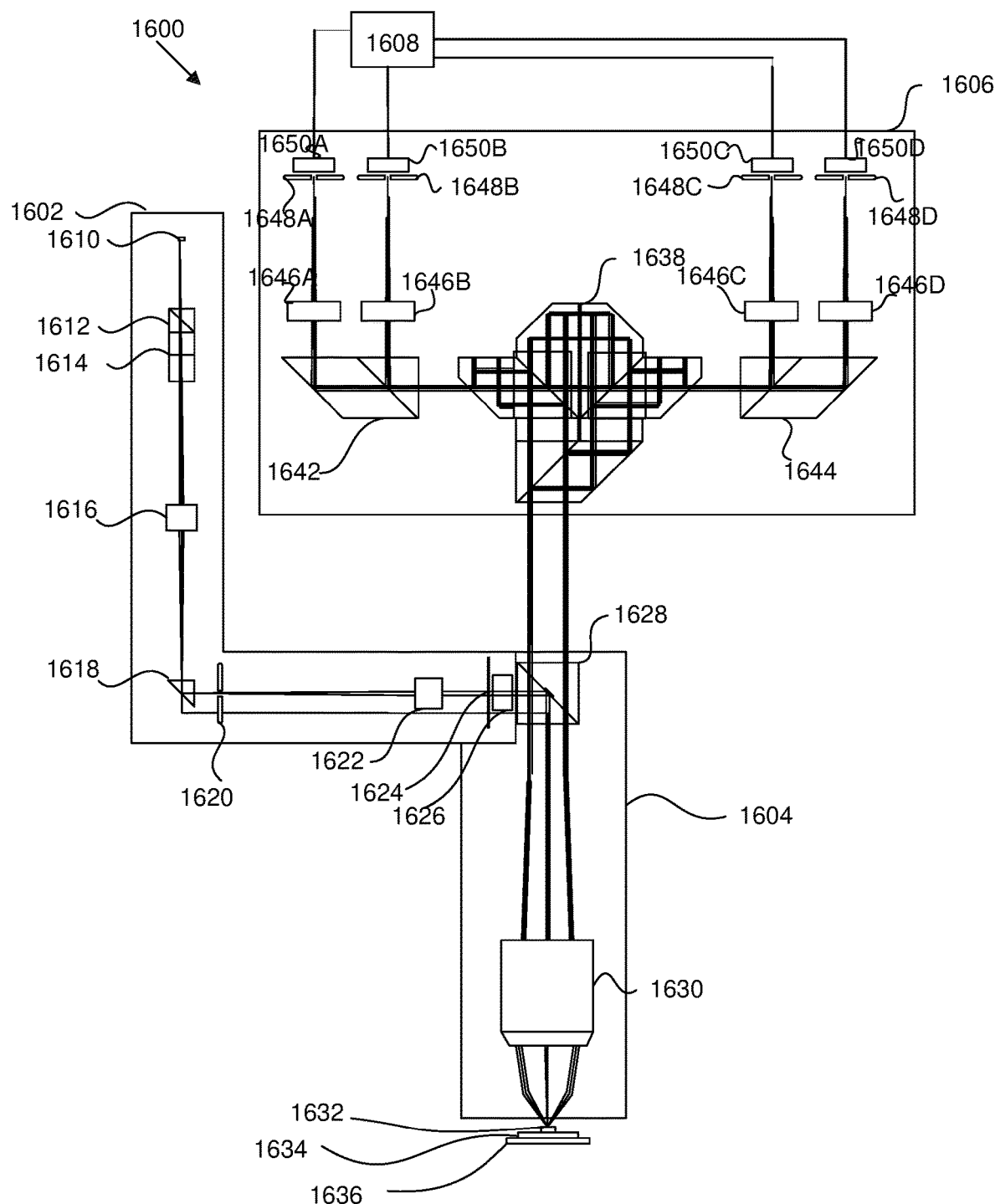
FIG. 16 shows a system, according to some embodiments.

FIG. 16 shows a schematic of a system 1600, according to some embodiments. In some embodiments, system 1600 can also represent a more detailed view of inspection apparatus 400 (FIGS. 4A and 4B). For example, FIG. 16 illustrates a more detailed view of illumination system 1612 and its functions.

In some embodiments, system 1600 includes an illumination system 1602, an optical system 1604, a detector system 1606, and a processor 1608. Illumination system 1602 can comprise a radiation source 1610, a polarizer 1612, a retarder 1614 (e.g., a waveplate), a first optical element(s) 1616 (e.g., a lens or lens system), a reflective element 1618 (e.g., a total internal reflection prism), a field stop 1620, a second optical element(s) 1622, a waveplate 1624, and an aperture stop 1626. Optical system 1604 can comprise a reflective element 1628 (e.g., spot mirror) and an optical element 1630 (e.g., an objective lens). The reflective element 1628 can act as a field stop for zero order diffracted radiation.

FIG. 16 shows a non-limiting depiction of system 1600 inspecting a target 1632 (also "target structure") on a substrate 1634. The substrate 1634 is disposed on a stage 1636 that is adjustable (e.g., a support structure that can move). It should be appreciated the structures drawn within illumination system 1602 and optical system 1604 are not limited to their depicted positions. The positions of structures can vary as necessary, for example, as designed for a modular assembly.

In some embodiments, target 1632 can comprise a diffractive structure. Target 1632 can reflect, refract, diffract, scatter, or the like, radiation. For ease of discussion, and without limitation, radiation that interacts with a target will be termed scattered radiation throughout. The scattered radiation can be collected by objective 1630.

The detection system 1606 can include a self-referencing interferometer 1638 and one or more detectors. The scattered radiation can be passed by optical element 1630 and to the self-referencing interferometer 1638.

In one aspect, a further beam splitter 1642 splits the optical signal into two paths A and B. One path can contain the sum of the two rotated fields, and the other can contain the difference. Similarly, a beam splitter 1644 can split the optical signal into two paths C and D, each path representing the sum and the difference of the rotated fields. The radiation of each path A, B, C, and D can be collected by a respective lens assembly 1646A, 1646B, 1646C, and 1646D. It then can go through an aperture 1648A, 1648B, 1648C, or 1648D, that eliminates most of the radiation from outside the spot on the substrate. Lens assembly 1646A, 1646B, 1646C, and 1646D can focus the radiation field into each detector 1650A, 1650B, 1650C, and 1650D respectively. Each detector can provide a time-varying signals (e.g., waveforms) synchronized with the physical scanning movement between the system 1600 and the target structure 1632. Signals from the detectors can be processed by processor 1608.

In some embodiments, system 1600 may be used to measure 12 different characteristics (e.g., color, polarization, color and polarization) without adding extra optical analog/digital boards (OADB) channels.

Figure 17:
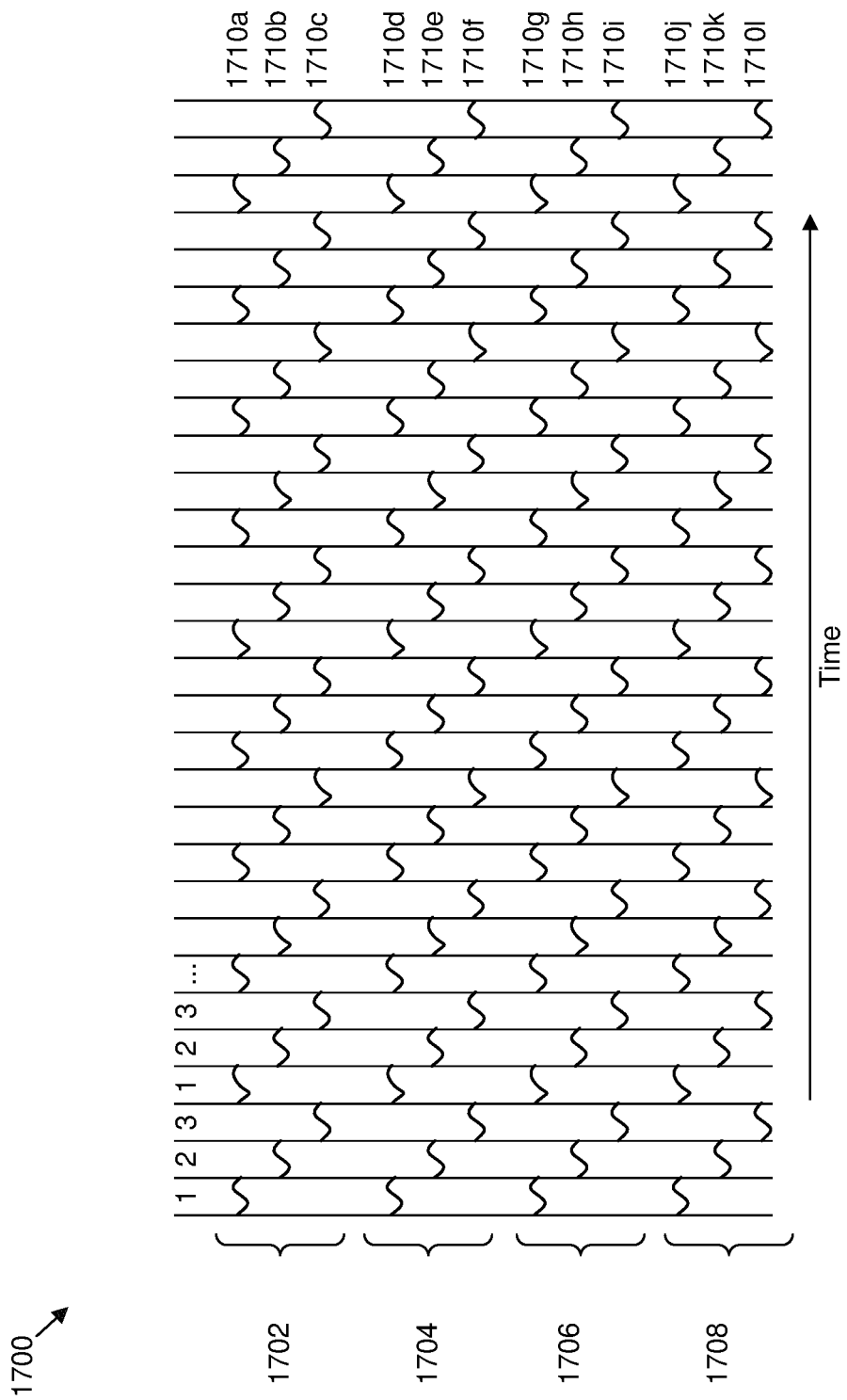
FIG. 17 shows sequential illumination shots for each channel of two or more channels of an inspection system, according to some embodiments.

FIG. 17 shows sequential illumination shots, according to some embodiments. In some embodiments, a target structure (e.g., target 1632 of FIG. 16) having a mark pitch of 1.6 µm and a scan length of 24 µm may use 30 signal periods. In some embodiments, three wavelengths (color) may be used for each channel of the four channels (channel 1702, channel 1704, channel 1706, channel 1708) of system 1600. Thus, each wavelength (e.g., wavelengths 1710a, 1710b, 1710c, 1710d, 1710e, 1710f, 1710g, 1710h, 1710i, 1710j, 1710k, 1710l) may use 10 signal periods. In some aspects, this can allow measuring more colors using system 1600 without adding optical analog/digital boards (OADB) channels. In some embodiments, the color may be tuned (e.g., between color 1-2-3).

In some embodiments, the scan length may be less than 30 signal periods. In some embodiments, each measurement may correspond to a half-period. Thus, 10 half-periods may be used per wavelength. Thus, each integration time may include a peak or a valley of the signal. In some aspects, the signals may be stitched and synchronized together.

In some embodiments, detection signals from each integration window are processed individually. Then, the property of the target structure may be determined based on an average of the detection signals.

Figure 18:
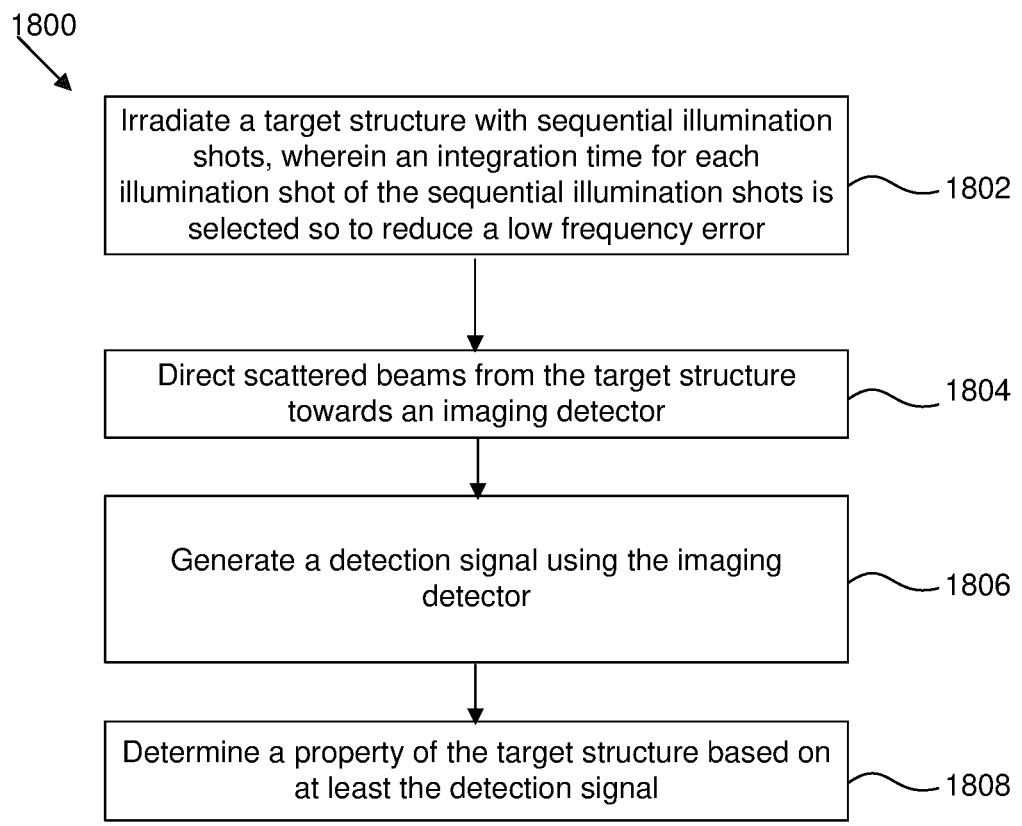
FIG. 18 shows a flowchart for operations performed by a system, according to some embodiments.

FIG. 18 shows method steps for performing a method 1800 including functions described herein, according to some embodiments. The method 1800 of FIG. 18 can be performed in any conceivable order and it is not required that all steps be performed. Moreover, the method steps of FIG. 18 described above merely reflect an example of steps and are not limiting. That is, further method steps and functions may be envisaged based embodiments described in reference to FIGS. 1-17.

Method 1800 includes irradiating a target structure with sequential illumination shots, as illustrated in step 1802. The integration time for each illumination shot of the sequential illumination shots is selected to minimize low frequency errors. In other words, the integration may be selected to minimize a dependence of a detection signal on low frequency errors. Method 1800 also includes directing scattered beams from the target structure towards an imaging detector, as illustrated in step 1804. Method 1800 further includes generating a detection signal using the imaging detector as illustrated in step 1806. Method 1800 further includes determining a property of the target structure based on at least the detection signal.

The embodiments may further be described using the following clauses:

1. A method comprising:
   irradiating a target structure with sequential illumination shots, wherein an integration time for each illumination shot of the sequential illumination shots is selected so to reduce a low frequency error;

directing scattered beams from the target structure towards an imaging detector;

generating a detection signal using the imaging detector; and determining a property of the target structure based on at least the detection signal.

2. The method of clause 1, wherein the irradiating the target structure with sequential illumination shots comprises temporally alternating between radiation at a first wavelength and/or a first polarization and radiation at a second wavelength and/or a second polarization.

3. The method of clause 1, wherein the irradiating the target structure with sequential illumination shots comprises:

splitting the integration time of radiation at a first wavelength into two or more integration times;

irradiating the target structure with illumination shots at the first wavelength for the two or more integration times; and irradiating the target structure with one or more illumination shots having another wavelength between the illumination shots at the first wavelength.

4. The method of clause 3, wherein:

each illumination shot of the one or more illumination shots has an integration time greater than the integration time associated with the illumination shots at the first wavelength; and each illumination shot of the one or more illumination shots has a wavelength different from another illumination shot of the one or more illumination shots.

5. The method of clause 1, wherein the irradiating the target structure with sequential illumination shots comprises:

splitting the integration time of radiation at a first wavelength into three or more integration times; and irradiating the target structure with a first illumination shot, a second illumination shot, and a third illumination shot at the first wavelength, wherein a time period between the first illumination shot and the second illumination shot is different than the time period between the second illumination shot and the third illumination shot.

6. The method of clause 1, wherein the sequential illumination shots are at a first wavelength and the method further comprises:

irradiating the target structure with radiation at a second wavelength;

directing second scattered beams from the target structure towards the imaging detector;

generating a second detection signal using the imaging detector; and adjusting the second detection signal based on the detection signal.

7. The method of clause 1, further comprising;

adjusting an intensity of each illumination shot of the sequential illumination shots so that the intensity of the sequential illumination shots are apodized with an envelope.

8. The method of clause 7, wherein the adjusting is performed by an illumination system configured to generate the sequential illumination shots.

9. The method of clause 7, wherein the adjusting is performed by a processor acting on the detection signal.

10. The method of clause 1, wherein the sequential illumination shots comprise a at least a set of illumination shots, wherein the first set includes illumination shots at different wavelengths; and wherein the at least a set is repeated one or more times in the sequential illumination shots.

11. The method of clause 1, further comprising:

irradiating the target structure with a second set of sequential illumination shots;

directing the scattered beams associated with the second set of the sequential illumination shots from the target structure towards another imaging detector;

generating another detection signal using the another imaging detector; and determining the property of the target structure based on at least the detection signal and the another detection signal.

12. The method of clause 1, wherein the irradiating the target structure with sequential illumination shots comprises:

illuminating the target structure with a sequence of illumination shots at a plurality of wavelengths; and repeating the illuminating for a duration of a measurement.

13. A system comprising:

an illumination system configured to irradiate a target structure with sequential illumination shots, wherein an integration time for each illumination shot of the sequential illumination shots is selected so to reduce a low frequency error;

a detection system configured to direct scattered beams from the target structure towards an imaging detector;

the imaging detector configured to generate a detection signal; and processing circuitry configured to determine a property of the target structure based on at least the detection signal.

14. The system of clause 13, wherein the illumination system is configured to temporally alternate between radiation at a first wavelength and/or a first polarization and radiation at a second wavelength and/or a second polarization.

15. The system of clause 13, wherein the illumination is configured to:

split the integration time of radiation at a first wavelength into two or more integration times;

irradiate the target structure with illumination shots at the first wavelength for two or more integration times; and irradiate the target structure with one or more illumination shots having another wavelength between the illumination shots at the first wavelength.

16. The system of clause 15, wherein:

each illumination shot of the one or more illumination shots has an integration time larger than the integration time associated with the illumination shot at the first wavelength; and each illumination shot of the one or more illumination shots have a wavelength different from another illumination shot of the one or more illumination shots.

17. The system of clause 13, wherein:

the sequential illumination shots are at first wavelength;

the illumination system is further configured to irradiate the target structure with radiation at a second wavelength;

the detection system is further configured to direct second scattered beams from the target structure towards the imaging detector;

the imaging detector is further configured to generate a second detection signal; and the processing circuitry is further configured to adjust the second detection signal based on the detection signal.

18. The system of clause 13, wherein the processing circuitry is further configured to adjust the detection signal so that weights of intensities of the sequential illumination shots are apodized with n envelope.

19. The system of clause 13, wherein the sequential illumination shots comprise at least a set of illumination shots, wherein the first set includes illumination shots at different wavelengths; and wherein the at least a set is repeated one or more times in the sequential illumination shots.

20. A lithography apparatus comprising:

an illumination apparatus configured to illuminate a pattern of a patterning device;

a projection system configured to project an image of the pattern onto a substrate; and a metrology system comprising:

an illumination system configured to irradiate a target structure with sequential illumination shots, wherein an integration time for each shot of the sequential illumination shots is selected so to reduce a low frequency error, a detection system configured to direct scattered beams from the target structure towards an imaging detector, the imaging detector configured to generate a detection signal, and processing circuitry configured to determine a property of the target structure based on at least the detection signal.

In some embodiments, the irradiating includes temporally alternating between radiation at a first wavelength and/or a first polarization and radiation at a second wavelength and/or a second polarization.

In some embodiments, the irradiating includes splitting the integration time of radiation at a first wavelength into two or more integration times, irradiating the target structure with illumination shots at the first wavelength for the two or more integration times, and irradiating the target structure with one or more illumination shots having another wavelength between the illumination shots at the first wavelength.

In some embodiments, the irradiating includes splitting the integration time of radiation at a first wavelength into three or more integration times, and irradiating the target structure with a first illumination shot, a second illumination shot, and a third illumination shot at the first wavelength. In some embodiments, a time period between the first illumination shot and the second illumination shot is different than the time period between the second illumination shot and the third illumination shot.

Commercially available examples of alignment sensors are the previously mentioned SMASH™, ORION™, and ATHENA™ sensor by ASML of Netherlands. Structures and functions of alignment sensors have been discussed in reference to FIG. 4 and in U.S. Pat. No. 6,961,116 and U.S. Pub. Appl. No. 2009/195768, which are all incorporated by reference herein in their entireties.

Although specific reference can be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track unit (a tool that typically applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

Although specific reference may have been made above to the use of embodiments of the present disclosure in the context of optical lithography, it will be appreciated that the present disclosure can be used in other applications, for example imprint lithography, and where the context allows, is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present disclosure is to be interpreted by those skilled in relevant art(s) in light of the teachings herein.

The terms "radiation," "beam," "light," "illumination," and the like as used herein may encompass all types of electromagnetic radiation, for example, ultraviolet (UV) radiation (for example, having a wavelength $\lambda$ of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as particle beams, such as ion beams or electron beams. Generally, radiation having wavelengths between about 400 to about 700 nm is considered visible radiation; radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm. Vacuum UV, or VUV (i.e., UV absorbed by gas), refers to radiation having a wavelength of approximately 100-200 nm. Deep UV (DUV) generally refers to radiation having wavelengths ranging from 126 nm to 428 nm, and in some embodiments, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

The term "substrate" as used herein describes a material onto which material layers are added. In some embodiments, the substrate itself can be patterned and materials added on top of it may also be patterned, or may remain without patterning.

Although specific reference can be made in this text to the use of the apparatus and/or system according to the present disclosure in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the disclosure have been described above, it will be appreciated that embodiments of the present disclosure may be practiced otherwise than as described. The descriptions are intended to be illustrative, not limiting. Thus it will be apparent to one skilled in the art that modifications may be made to the disclosure as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein.

The breadth and scope of the protected subject matter should not be limited by any of the above-described exemplary embodiments, but should be defined only in accordance with the following claims and their equivalents.

The invention claimed is:

1. A method comprising:
    irradiating a target structure with sequential illumination shots, wherein an integration time for each illumination shot of the sequential illumination shots is selected so to reduce a low frequency error;
    directing scattered beams from the target structure towards an imaging detector;
    generating a detection signal using the imaging detector; and
    determining a property of the target structure based on at least the detection signal.

2. The method of claim 1, wherein the irradiating the target structure with sequential illumination shots comprises temporally alternating between radiation at a first wavelength and/or a first polarization and radiation at a second wavelength and/or a second polarization.

3. The method of claim 1, wherein the irradiating the target structure with sequential illumination shots comprises:
    splitting the integration time of radiation at a first wavelength into two or more integration times;
    irradiating the target structure with illumination shots at the first wavelength for the two or more integration times; and
    irradiating the target structure with one or more illumination shots having another wavelength between the illumination shots at the first wavelength.

4. The method of claim 3, wherein:
    each illumination shot of the one or more illumination shots has an integration time greater than the integration time associated with the illumination shots at the first wavelength; and
    each illumination shot of the one or more illumination shots has a wavelength different from another illumination shot of the one or more illumination shots.

5. The method of claim 1, wherein the irradiating the target structure with sequential illumination shots comprises:
    splitting the integration time of radiation at a first wavelength into three or more integration times; and
    irradiating the target structure with a first illumination shot, a second illumination shot, and a third illumination shot at the first wavelength,
    wherein a time period between the first illumination shot and the second illumination shot is different than the time period between the second illumination shot and the third illumination shot.

6. The method of claim 1, wherein the sequential illumination shots are at a first wavelength and the method further comprises:
    irradiating the target structure with radiation at a second wavelength;
    directing second scattered beams from the target structure towards the imaging detector;
    generating a second detection signal using the imaging detector; and
    adjusting the second detection signal based on the detection signal.

7. The method of claim 1, further comprising;
    adjusting an intensity of each illumination shot of the sequential illumination shots so that the intensity of the sequential illumination shots are apodized with an envelope.

8. The method of claim 7, wherein the adjusting is performed by an illumination system configured to generate the sequential illumination shots.

9. The method of claim 7, wherein the adjusting is performed by a processor acting on the detection signal.

10. The method of claim 1, wherein the sequential illumination shots comprise at least a set of illumination shots, wherein the set includes illumination shots at different wavelengths; and
    wherein the at least a set is repeated one or more times in the sequential illumination shots.

11. The method of claim 1, further comprising:
    irradiating the target structure with a second set of sequential illumination shots;
    directing the scattered beams associated with the second set of the sequential illumination shots from the target structure towards another imaging detector;

generating another detection signal using the another imaging detector; and determining the property of the target structure based on at least the detection signal and the another detection signal.

12. The method of claim 1, wherein the irradiating the target structure with sequential illumination shots comprises:

illuminating the target structure with a sequence of illumination shots at a plurality of wavelengths; and repeating the illuminating for a duration of a measurement.

13. A system comprising:

an illumination system configured to irradiate a target structure with sequential illumination shots, wherein an integration time for each illumination shot of the sequential illumination shots is selected so to reduce a low frequency error;

a detection system configured to direct scattered beams from the target structure towards an imaging detector;

the imaging detector configured to generate a detection signal; and processing circuitry configured to determine a property of the target structure based on at least the detection signal.

14. The system of claim 13, wherein the illumination system is configured to temporally alternate between radiation at a first wavelength and/or a first polarization and radiation at a second wavelength and/or a second polarization.

15. The system of claim 13, wherein the illumination system is configured to:

split the integration time of radiation at a first wavelength into two or more integration times;

irradiate the target structure with illumination shots at the first wavelength for two or more integration times; and irradiate the target structure with one or more illumination shots having another wavelength between the illumination shots at the first wavelength.

16. The system of claim 15, wherein:

each illumination shot of the one or more illumination shots has an integration time larger than the integration time associated with the illumination shots at the first wavelength; and each illumination shot of the one or more illumination shots has a wavelength different from another illumination shot of the one or more illumination shots.

17. The system of claim 13, wherein:

the sequential illumination shots are at first wavelength;

the illumination system is further configured to irradiate the target structure with radiation at a second wavelength;

the detection system is further configured to direct second scattered beams from the target structure towards the imaging detector;

the imaging detector is further configured to generate a second detection signal; and the processing circuitry is further configured to adjust the second detection signal based on the detection signal.

18. The system of claim 13, wherein the processing circuitry is further configured to adjust the detection signal so that weights of intensities of the sequential illumination shots are apodized with an envelope.

19. The system of claim 13, wherein the sequential illumination shots comprise at least a set of illumination shots, wherein the set includes illumination shots at different wavelengths; and wherein the at least a set is repeated one or more times in the sequential illumination shots.

20. A lithography apparatus comprising:

an illumination apparatus configured to illuminate a pattern of a patterning device;

a projection system configured to project an image of the pattern onto a substrate; and a metrology system comprising:

an illumination system configured to irradiate a target structure with sequential illumination shots, wherein an integration time for each shot of the sequential illumination shots is selected so to reduce a low frequency error, a detection system configured to direct scattered beams from the target structure towards an imaging detector, the imaging detector configured to generate a detection signal, and processing circuitry configured to determine a property of the target structure based on at least the detection signal.

* * * * *